(12) United States Patent
Komatsuda

(10) Patent No.: US 6,819,403 B2
(45) Date of Patent: Nov. 16, 2004

(54) ILLUMINATION OPTICAL SYSTEM, EXPOSURE APPARATUS, AND MICRODEVICE MANUFACTURING METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/244,377

(22) Filed: Sep. 17, 2002

(65) Prior Publication Data

US 2003/0067591 A1 Apr. 10, 2003

(30) Foreign Application Priority Data

Sep. 18, 2001 (JP) .................................... 2001-283637

(51) Int. Cl.⁷ .................. G03B 27/72; G03B 27/42; G03B 27/54
(52) U.S. Cl. .................. 355/71; 355/53; 355/67
(58) Field of Search .................. 355/53, 67, 69, 355/71, 77; 250/492.2

(56) References Cited

U.S. PATENT DOCUMENTS

| | | | |
|---|---|---|---|
| 5,473,410 A | | 12/1995 | Nishi |
| 5,486,896 A | * | 1/1996 | Hazama et al. ............... 355/71 |
| 6,051,842 A | * | 4/2000 | Yamamoto .................. 250/548 |
| 6,366,341 B1 | * | 4/2002 | Shirato et al. ................ 355/69 |
| 6,404,499 B1 | * | 6/2002 | Stoeldraijer et al. ......... 356/400 |

* cited by examiner

Primary Examiner—Alan Mathews
(74) Attorney, Agent, or Firm—Finnegan, Henderson, Farabow, Garrett & Dunner LLP

(57) ABSTRACT

An illumination optical system, exposure apparatus, and microdevice manufacturing method where the illumination optical system has provided in one or more optical paths of actinic light IL emitted from one or more actinic light sources two or more filter members having transmittance distributions substantially definable by one or more functions comprising one or more functions of order three or higher with respect to transmittance as a function of position in one or more directions substantially transverse to one or more optical axes.

42 Claims, 11 Drawing Sheets

ILLUMINATION OPTICAL SYSTEM, EXPOSURE APPARATUS, AND MICRODEVICE MANUFACTURING METHOD

CROSS-REFERENCE TO RELATED APPLICATION AND CLAIM OF FOREIGN PRIORITY DATE

This application claims right of benefit of prior filing date of Japanese Patent Application No. H13-283637 (2001), filed 18 Sep. 2001, entitled "Illumination Optical System, Exposure Apparatus, and Microdevice Manufacturing Method," the content of which is incorporated herein by reference in its entirety.

DESCRIPTION OF THE INVENTION

1. Field of the Invention

The present invention pertains to an illumination optical system, exposure apparatus, and microdevice manufacturing method. In particular, the present invention relates to an illumination optical system capable of illuminating a mask, reticle, or other such object; the optical system's illumination having a uniform illuminance distribution. The present invention further relates to an exposure apparatus equipped with such an illumination optical system and capable of being used, among other things, during the manufacture of semiconductor elements, liquid crystal display elements, image pickup elements, thin-film magnetic heads, and/or other such microdevices. The present invention also relates to a microdevice manufacturing method employing such an exposure apparatus.

2. Background of the Invention

Exposure apparatuses may be employed during photolithographic operations—such operations representing a portion of the operations for the manufacture of semiconductor elements, liquid crystal display elements, image pickup elements, thin-film magnetic heads, and/or other such microdevices—to transfer patterns formed on masks or reticles (hereinafter referred to collectively as "mask") onto wafers, glass plates, substrates or the like (hereinafter referred to collectively as "substrate") which have been coated with photoresist or other such photosensitive material. To be able to illuminate a mask with illumination of uniform illuminance distribution, such an exposure apparatus may be equipped with an illumination optical system capable of causing light emitted from an excimer laser or other such light source to possess a uniform illuminance distribution within a beam formed so as to have a prescribed cross-sectional shape.

If the illuminance distribution of the light emitted from such an illumination optical system varies over the surface of the mask or substrate, there will be nonuniformity in linewidth throughout the pattern formed on the substrate. This variation occurs because the exposure dose of the light irradiating the substrate will vary in correspondence to that illuminance distribution. However, high uniformity in linewidth is demanded during the manufacture of semiconductor elements employed in logic circuits, such semiconductor elements representing one category among the semiconductor elements mentioned above as examples of microdevices. Linewidth uniformity is required because nonuniformity in pattern linewidth will result in decreased operational speed. As an example of the significance of this fact, central processor units (CPUs) operating at frequencies of several GHz have in recent years become standard, and because further increases in operating speed can be expected to be achieved in the future, increased uniformity of pattern linewidth is likely to be extremely important.

To cause light irradiating a substrate to have a uniform exposure over the surface of the substrate, conventional exposure apparatuses have employed illumination optical systems possessing condenser lenses having distortion. The value of the distortion being varied so as to achieve a uniform exposure dose across the surface of the substrate. Referring to FIG. 11, the principle by which the illuminance distribution might be varied by varying distortion of a condenser lens is briefly described. FIG. 11 is a drawing to assist in description of the principle by which an illuminance distribution might be adjusted by means of a condenser lens.

In FIG. 11, P1 represents a light source, 100 represents a condenser lens, and P2 represents the plane of an object to be illuminated ("object plane"). This object plane P2 might for example be the plane in which the pattern on a mask is formed. In the discussion below, θ represents the exit angle of a light beam emitted from light source P1 (the exit angle of a light beam emitted so as to be parallel to optical axis AX being taken to have θ=0), f represents the focal length of condenser lens 100, and h represents the distance from optical axis AX to a location on object plane P2 at which the light beam emitted from light source P1 at exit angle θ is incident thereon.

Assuming standard Koehler illumination, the relationship describing projection by the condenser lens will, in general, be given by FORMULA (1), below:

$$h = f \cdot g(\theta) \qquad (1)$$

Note that at FORMULA (1), above, $g(\theta)$ is a function of θ.

If we assume that light source P1 is a perfectly diffusing surface (a photometrically ideal surface illuminant), then illumination at object plane P2 will be uniform when $g(\theta) = \sin(\theta)$. We therefore take the distortion of condenser lens 100 to be zero when $g(\theta) = \sin(\theta)$.

Let us first consider the case in which the distortion of condenser lens 100 is zero. In such a case, the infinitesimal area dS of the locus on object plane P2 of a light beam of infinitesimal solid angle dΩ emitted from light source P1 is given by FORMULA (2), below:

$$dS = dh \, d\psi \, h = f^2 \sin\theta \cos\theta \, d\theta \, d\psi \qquad (2)$$

... where ψ is an angle of rotation about optical axis AX.

We next consider the case in which condenser lens 100 has nonzero distortion. The relationship describing projection when there is n% distortion at some image height is given by FORMULA (3), below:

$$h = f \sin\theta (1 - n/100) \qquad (3)$$

Now, because the dimensions of condenser lens 100 are fairly uncomplicated, there is little generation of aberration of order three or higher. It is therefore sufficient to likewise only consider distortion attributable to aberration up to the third order. Upon making such an assumption, since distortion is now assumed to be proportional to the square of image height, we can express this in the form $n = \alpha \sin^2\theta$, where α is a constant.

In such a case, the infinitesimal area dS of the locus on object plane P2 of a light beam of infinitesimal solid angle dΩ emitted from light source P1 is given by FORMULA (4), below:

$$dS = dh\, d\psi\, h \qquad (4)$$

$$f^2 \sin\theta \cos\theta\, d\theta\, d\psi (1 - 4\alpha \sin^2\theta/100 + 3\alpha^2 \sin^4\theta/10000)$$

FORMULA (2), above, gives the infinitesimal area dS of the locus on object plane P2 of a light beam of infinitesimal solid angle dΩ emitted from light source P1 for zero distortion at condenser lens 100. FORMULA (4), above, gives the infinitesimal area dS of the locus on object plane P2 of a light beam of infinitesimal solid angle dΩ emitted from light source P1 for nonzero distortion at condenser lens 100.

FORMULAS (2) and (4) determine the infinitesimal areas dS of the loci on object plane P2 produced by light beams of identical infinitesimal solid angle dΩ emitted from light source P1. Using FORMULAS (2) and (4), one obtains a smaller infinitesimal area dS when there is distortion as compared with the infinitesimal area dS obtained when there is no distortion. This is so despite use of the same infinitesimal solid angle dΩ. From these results, one can conclude that illuminance will be greater by a corresponding amount.

If we now take the ratio of the expressions at the right sides of FORMULAS (2) and (4), above, we find that infinitesimal area dS is foreshortened due to distortion by a factor given by:

$$1 - 4\alpha \sin^2\theta/100 + 3\alpha^2 \sin^4\theta/10000.$$

Since the term $3\alpha^2 \sin^4\theta/10000$ appearing in this formula can be ignored when distortion is exceedingly small, i.e., for $\alpha \ll 1$, the factor by which infinitesimal area dS is foreshortened due to distortion can in such case be said to be substantially given by:

$$1 - 4\alpha \sin^2\theta/100 \qquad (5)$$

The smaller irradiated area for the same identical infinitesimal solid angle exiting the light source means that illuminance will be higher by a corresponding amount. Specifically, from FORMULA (5) we see that when there is distortion at the condenser lens, illuminance will display a distribution proportional to the square of sin θ (∝ image height). From FORMULA (5), we can also see that the magnitude of the second-order component of the illuminance distribution produced will be proportional to α, i.e., to the amount of distortion.

The foregoing principle has conventionally been employed to adjust the illuminance distribution by varying the amount of distortion at the condenser lens. Note that whereas we have, in the foregoing description, confined our discussion to the change in the second-order component of the nonuniformity in illuminance produced by a change in the amount of distortion at condenser lens 100, it should of course be understood that the first-order component of the illuminance distribution (the component proportional to image height) may also be adjusted together with the second-order component through use of various other adjustment means.

While the illuminance distribution of the light irradiating the substrate has been adjusted in conventional exposure apparatuses by varying the amount of distortion at a condenser lens as described above, more recently the requirements dictated by uniform linewidth have made it difficult to vary condenser lens distortion. The reason for this is that varying the amount of condenser lens distortion alters the numerical aperture of the illuminating light at every value of image height thereof. This is generally described in Japanese Patent Application Publication Kokai No. H9-22869 (1997).

Now we have already mentioned that in order to form a pattern with uniform linewidth it is necessary that the light irradiating a substrate have uniform illuminance distribution over the surface of the substrate, but it is also necessary that numerical aperture be uniform within the region of exposure at which the substrate is irradiated by light. This is because if numerical aperture is not uniform within the region of exposure, i.e., if numerical aperture varies as a function of location within this exposure region, spatial coherence will be nonuniform, and this will cause the linewidth of the pattern formed on the substrate to be nonuniform.

There is therefore a need in modern exposure apparatuses for a mechanism by which the second-order component of the illuminance distribution might be adjusted without having to vary condenser lens distortion. But because there has not conventionally been a mechanism which would satisfy such requirements, illuminance distribution has conventionally been adjusted in an extremely tedious process in which a plurality of filters having a variety of transmittance distributions are prepared and swapped in so as to minimize the change in condenser lens distortion, with the final fine-tuning being carried out by making minuscule adjustments of condenser lens distortion within a range as permitted by allowed tolerances.

SUMMARY OF THE INVENTION

The present invention was conceived in light of the foregoing state of affairs and has as its object the provision of an illumination optical system permitting nonstepwise adjustment of the second-order component of the illuminance distribution without the need for any alteration in condenser lens distortion whatsoever, an exposure apparatus equipped with such an illumination optical system, and a microdevice manufacturing method in which microdevice manufacture is carried out by employing such an exposure apparatus to form a highly detailed pattern.

In order to solve one or more of the foregoing problems, the present invention sets forth an illumination optical system for illuminating one or more objects with a light emitted from one or more light sources. The illumination optical system has two or more filter members located in one or more optical paths of the light emitted from at least one of the light. The optical system further has transmittance distributions substantially definable by one or more functions of order three or higher with respect to transmittance as a function of position in one or more directions substantially transverse to at least one or more of the optical paths.

In accordance with this aspect of the present invention, because two or more filter members arranged in optical paths have transmittance distributions substantially definable by functions comprising functions of order three or higher with respect to transmittance as a function of position in directions substantially transverse to optical paths, it is possible to adjust second-order components of illuminance distributions through use of filters alone. Furthermore, the combination of such transmittance distributions permits attainment of combined transmittance distributions which can be varied after the fashion of second-order functions with respect to transmittance as a function of position in directions substantially transverse to optical paths. And because it is thus possible to adjust second-order components of illuminance distributions using filters alone, there is no longer any need whatsoever for the sort of varying of condenser lens distortion which was necessary for adjustment of the second-order component of the illuminance distribution. Furthermore, it is possible to eliminate the change in numerical aperture of illuminating light at every value of image height thereof which occurs as a result of varying of condenser lens distortion without losing the ability to adjust the second-order component of the illuminance distribution. This is extremely favorable from the standpoint of ability to generate a pattern having uniform linewidth.

Furthermore, in the illumination optical system in accordance with the first aspect of the present invention, it is preferred that at least one of the transmittance distributions substantially definable by one or more functions comprising one or more functions of order three or higher be a transmittance distribution substantially definable by one or more functions comprising a third-order function. Moreover, the illumination optical system may further include one or more drive apparatuses capable of moving at least one of the two or more filter members in one or more directions substantially transverse to at least one of the one or more optical paths.

This embodiment of the illumination optical system is further characterized in that at least one of the one or more drive apparatuses may be capable of moving at least one of the two or more filter members continuously in one or more directions substantially transverse to at least one of the one or more optical paths. In accordance with this aspect of the present invention, because filter members may be moved continuously in directions substantially transverse to optical paths, it is possible to adjust illuminance distribution quickly and with high precision.

Moreover, this embodiment of the invention is further characterized in that it may further comprise one or more control apparatuses capable of causing at least one of the one or more drive apparatuses to be driven in such fashion as to permit control of the positional relationship between at least two of the two or more filter members in one or more directions substantially transverse to at least one of the one or more optical paths.

In order to solve one or more of the foregoing problems, an illumination optical system in accordance with a second aspect of the present invention is characterized in that, it includes two or more filter members located in one or more optical paths of light emitted from at least one or more light source. The illumination optical system further has transmittance distributions substantially definable by one or more functions having one or more functions of order three or higher with respect to transmittance as a function of position in respectively at least a first direction which is substantially transverse to at least one of the one or more optical paths and a second direction Y which is substantially perpendicular to the first direction.

In accordance with this aspect of the present invention, because two or more filter members arranged in optical paths have transmittance distributions substantially definable by functions comprising functions of order three or higher respectively with respect to transmittance as a function of position in first directions substantially transverse to optical paths and second directions, it is possible to adjust second-order components of illuminance distributions through use of filters alone. Furthermore, the combination of such transmittance distributions permits the attainment of combined transmittance distributions which can be varied after the fashion of second-order functions with respect to transmittance as a function of position in directions substantially transverse to optical paths. In addition, because it is thus possible to adjust second-order components of illuminance distributions using filters alone, there is no longer any need whatsoever for the sort of varying of condenser lens distortion which was necessary conventionally for adjustment of the second-order component of the illuminance distribution. Furthermore, it is consequently possible to eliminate the alteration in numerical aperture of illuminating light at every value of image height thereof which occurs as a result of varying of condenser lens distortion without losing the ability to adjust the second-order component of the illuminance distribution. This is extremely favorable from the standpoint of ability to generate a pattern having uniform linewidth. And because it is possible to respectively adjust such second-order components in first and second directions, accommodation of a wide variety of illuminance distributions is permitted.

Furthermore, in the illumination optical system in accordance with the second aspect of the present invention, it is preferred that at least one of the transmittance distributions substantially definable by one or more functions comprising one or more functions of order three or higher be a transmittance distribution substantially definable by one or more functions comprising a third-order function. Moreover, this illumination optical system further comprises one or more drive apparatuses capable of moving at least one of the two or more filter members in at least one direction substantially identical with or substantially parallel to at least one of the first or second directions.

An illumination optical system in accordance with the second aspect of the present invention is furthermore characterized in that at least one of the one or more drive apparatuses may be capable of moving at least one of the two or more filter members continuously in at least one direction substantially identical with or substantially parallel to at least one of the first or second directions. In accordance with this aspect of the present invention, because filter members may be moved continuously in directions substantially identical with or substantially parallel to the first or second directions, it is possible to adjust illuminance distribution quickly and with high precision in these directions.

An illumination optical system in accordance with the second aspect of the present invention is in addition characterized in that it may further comprise one or more control apparatuses capable of causing at least one of the one or more drive apparatuses to be driven in such fashion as to permit control of the positional relationship between at least two of the two or more filter members in at least one direction substantially identical with or substantially parallel to at least one of the first or second directions. It is preferred that at least one of the two or more filter members be capable of being arranged near at least one of the one or more objects to be illuminated and/or substantially in or near a plane optically conjugate to a plane more or less containing at least one of the one or more objects to be illuminated.

It is moreover favorable in the illumination optical systems in accordance with the first and second aspects of the present invention that at least two of the two or more filter members be capable of being arranged so as to have respective transmittance distributions in more or less mutually inverse relationship with respect to transmittance as a function of position in one or more directions substantially transverse to at least one of the one or more optical paths.

In order to solve one or more of the foregoing problems, an exposure apparatus in accordance with a first aspect of the present invention is characterized in that, in the context of an exposure apparatus for illuminating one or more masks with a light from one or more light sources and transferring one or more patterns formed on at least one of the one or more masks to one or more photosensitive substrates W, such exposure apparatus comprises one or more mask stages constructed so as to permit at least one of the one or more masks to be loaded thereon. The exposure apparatus further has one or more substrate stages constructed so as to permit at least one of the one or more photosensitive substrates to be loaded thereon. The apparatus further includes one or more illumination optical systems in accordance with the first or second aspects of the present invention and capable of illuminating at least one of the one or more masks with light from at least one of the one or more light sources.

In order to solve one or more of the foregoing problems, an exposure apparatus in accordance with a second aspect of the present invention includes one or more mask stages constructed so as to be capable of movement while at least one of the one or more masks is loaded thereon. The exposure apparatus further includes one or more substrate stages constructed so as to be capable of movement while at least one of the one or more photosensitive substrates is loaded thereon. There is in addition, one or more illumination optical systems according to the first aspect of the present invention and capable of illuminating at least one of the one or more masks with a light from at least one of the one or more light sources. In addition the apparatus had one or more projection optical systems capable of forming on at least one of the one or more photosensitive substrates at least one image of at least one of the one or more patterns on at least one of the one or more masks R.

The exposure apparatus in accordance with the second aspect of the present invention further contains one or more mask stage drive systems coupled to at least one of the one or more mask stages and capable of causing at least one of the one or more mask stages to move. There is also included one or more substrate stage drive systems coupled to at least one of the one or more substrate stages and capable of causing at least one of the one or more substrate stages to move. The apparatus in this embodiment further has one or more controllers coupled to at least one of the one or more mask stage drive systems and at least one of the one or more substrate stage drive systems 41. The controllers are capable of controlling at least one of the one or more mask stage drive systems and at least one of the one or more substrate stage drive systems such that at least one of the one or more masks and at least one of the one or more photosensitive substrates are made to move in one or more directions substantially identical with or substantially parallel to one or more scan directions in correspondence to at least one magnification of at least one of the one or more projection optical systems PL. At least one of the one or more directions is substantially transverse to at least one of the one or more optical paths being capable of being set so as to be substantially transverse to one or more directions corresponding to at least one of the one or more scan directions.

As used herein, "directions corresponding to scan directions" refers to directions substantially identical with or substantially parallel to projections of scan directions onto filter members by portions of optical systems between masks and filter members, inclusive.

In order to solve one or more of the foregoing problems, a microdevice manufacturing method in accordance with the first aspect of the present invention is characterized in that it comprises an expose step wherein at least one exposure apparatus in accordance with the first and/or second aspects of the present invention is used to expose at least one of the one or more photosensitive substrates W so as to form thereon one or more complete and/or partial latent images of at least one of the one or more patterns present on at least one of the one or more masks. The method also includes a developing step wherein at least one of the one or more latent images on at least one of the one or more photosensitive substrates W is developed.

Some of the various principles behind operation of the present invention will now be described. Here, for convenience of description, we take the case of an illumination optical system comprising two filter members having transmittance distributions representable by third-order power series with respect to transmittance as a function of position in respectively a first direction (x direction) transverse to an optical path and a second direction (y direction) perpendicular to the first direction. As used herein, a "third-order power series" is in general a function of the form $T=ax^3+bx^2+cx+d$, where a, b, c, and d are constants.

If we assume that the transmittance distributions of the filter members are functions of x and y, then a filter member having a transmittance distribution T(x, y) representable by a third-order power series will be described by FORMULA (6):

$$T(x, y)=ax^3+bx^2+cx+ey^3+fy^2+gy+d \qquad (6)$$

... where a, b, c, d, e, f, and g are constants.

To further simplify our description, in the description that follows we consider the case of a filter member having a transmittance distribution T(x, y) as described by FORMULA (7):

$$T(x, y)=ax^3+d \qquad (7)$$

Two filter members having transmittance distributions T(x, y) as described by FORMULA (7), above, might be prepared, and one might be arranged such that it is rotated 180° with respect to the other in the xy plane. Such an arrangement will result in one of the two filter members having a transmittance distribution which we can write as $T(x, y)=-ax^3+d$. The combined transmittance distribution T1 of the two filter members will, in such a case, be given by FORMULA (8):

$$T1=(ax^3+d)(-ax^3+d)=-a^2x^6+d^2 \qquad (8)$$

To simplify the mathematical analysis that follows and to clarify our description, we now introduce suitable approximations for transmittance. Consider the relationship indicated by FORMULA (9), below, when the values of α and β are very close to 1.

$$(\alpha-1)(\beta-1)=\alpha\beta-\alpha-\beta+1 \qquad (9)$$

We can arrange FORMULA (9) to get FORMULA (10):

$$\alpha\beta-(\alpha-1)(\beta-1)=\alpha+\beta-1 \qquad (10)$$

But because we have assumed (for purposes of description) that the values of α and β are very close to 1, it is clear in such case that $(\alpha-1)(\beta-1)$ will be much smaller than $\alpha\beta$. FORMULA (10) can, in such case, therefore be written in the form indicated by FORMULA (11):

$$\alpha\beta\approx\alpha+\beta-1 \qquad (11)$$

If we assume that the transmittances of the two filter members are very close to 1 (i.e., that transmittance is on the order of 95% to 100%), we can use the relationship at FORMULA (11) to rewrite FORMULA (8), above, as indicated at FORMULA (12), below, which, while being an approximation is nonetheless extremely simple in form.

$$T1 = (ax^3+d)(-ax^3+d) \cong (ax^3+d)+(-ax^3+d)-1 = 2d-1 \qquad (12)$$

Next, if one of the two filter members is displaced by an amount j in the −x direction and the other is displaced by an amount j in the +x direction so as to obtain an arrangement wherein the two filter members are parallel to the optical axis, but occupy locations displaced by some small amount (here, 2j) with respect to each other, the combined transmittance distribution T2 will in this case be given by FORMULA (13), below.

$$T2 = \{a(x+j)^3 + d\}\{-a(x-j)^3 + d\} \qquad (13)$$
$$\cong \{a(x+j)^3 + d\} + \{-a(x-j)^3 + d\} - 1$$
$$= 6ajx^2 + 2aj^3 + 2d - 1$$

Subtracting FORMULA (12) from FORMULA (13) allows us to determine the change in transmittance produced as a result of causing the two filter members to be displaced relative to one another in the x direction, which we write as FORMULA (14):

$$T2-T1 = 6ajx^2 + 2aj^3 \qquad (14)$$

Displacing two filter members relative to one another thus causes a change in the second-order transmittance distribution. Furthermore, as can be seen from FORMULA (14), the amount of the change in the second-order transmittance distribution is proportional to the amount j by which the filter members are displaced. Note that while FORMULA (14), above, includes a constant component equal to $2aj^3$, meaning that the transmittance is itself offset by an amount which varies as a function of j, because the value of the constant "a" is in reality sufficiently small relative to the value of the constant "d," the amount of this offset will not present a problem in practice.

As described above, by arranging two filter members having transmittance distributions representable by third-order power series such that they are substantially coincident with or substantially parallel to an optical path, and by displacing one such filter relative to the other in a direction substantially transverse to such optical path, it is possible to achieve a composite filter which is capable of correcting second-order components of transmittance distributions. It is therefore possible to correct second-order components of illuminance distributions, without having to vary the amount of condenser lens distortion, by arranging these two filter members near the object plane or substantially in or near a plane optically conjugate to the object plane.

Note that as mentioned above and for convenience of description, the foregoing discussion treats the case in which the filter members respectively have transmittance distributions of the form $T(x, y) = ax^3 + d$. More generally, a filter member capable of being used in the present invention may have transmittance distribution of the form:

$$T(x, y) = ax^3 + bx^2 + cx + d$$

. . . where a, b, c, and d are constants.

Moreover, a filter member capable of being used in the present invention may have transmittance distribution as indicated at FORMULA (6), above; i.e., $$T(x, y) = ax^3 + bx^2 + cx + ey^3 + fy^2 + gy + d$$

. . . where a, b, c, d, e, f, and g are constants.

In such a case, second-order components of illuminance distributions may be independently adjusted in the two directions x and y by displacing respective filter members relative to one another in the two directions x and y. Furthermore, whereas the foregoing description treats the example of the case where filter members have transmittance distributions representable by third-order power series, components representable by higher-order power series and/or components representable for example by trigonometric functions and/or other such functions may alternatively or additionally be present.

Furthermore, there being no reason that the number of filter members must be limited to two as in the foregoing description, a similar effect may be achieved through combinations of various pluralities of filter members. For example, independent adjustment of second-order components of illuminance distributions in the x direction and second-order components of illuminance distributions in the y direction may be easily achieved through combination of four filters respectively having the transmittance distributions Ta(x, y), Tb(x, y), Tc(x, y), and Td(x, y), below.

$$Ta(x, y) = ax^3 + d$$
$$Tb(x, y) = -ax^3 + d$$
$$Tc(x, y) = ay^3 + d$$
$$Td(x, y) = -ay^3 + d$$

Moreover, whereas the foregoing description confined itself to adjustment of second-order components of illuminance distributions, because transmittance distributions of the filter members of the present invention may have substantial second-order components, it is possible, through collective decentration of such filter combinations taken as a whole, to correct first-order components of illuminance distributions.

Furthermore, the filter members having such transmittance distributions may be prepared using optical thin films or the like, with film design parameters being varied as a function of location. Alternatively, the filter members may be prepared by vapor deposition of light-occluding or light-attenuating microdots of size on the order of or smaller than the limit of resolution on appropriate stock, with the density of such microdots being varied as a function of location; and so forth. There is in fact no particular limitation with regard to the method by which the filter members having such transmittance distributions are prepared. In the event that filters having such transmittance distributions are prepared by varying the probability of existence of microdots as a function of location, it is desirable that there be no particular order to the arrayal of microdots (i.e., that locations having identical transmittances on the respective filter members not have identical arrayal of dots); or where there is a particular order, it is desirable that such particular order be different from filter member to filter member.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

In accordance with one or more aspects of the present invention, because two or more filter members arranged in optical paths have transmittance distributions substantially definable by functions comprising functions of order three or higher with respect to transmittance as a function of position in directions substantially transverse to optical paths, it is possible to adjust second-order components of illuminance distributions through use of filters alone. Furthermore, the combination of such transmittance distributions permits attainment of combined transmittance distributions which can be varied after the fashion of second-order functions with respect to transmittance as a function of position in directions substantially transverse to optical paths. And because it is thus possible to adjust second-order components of illuminance distributions using filters alone, there is no longer any need whatsoever for the sort of varying of condenser lens distortion which was necessary for adjustment of the second-order component of the illuminance distribution. Furthermore, it is possible to eliminate the change in numerical aperture of illuminating light at every value of image height thereof which occurs as a result of varying of condenser lens distortion without losing the ability to adjust the second-order component of the illuminance distribution. This is extremely favorable from the standpoint of ability to generate a pattern having uniform linewidth.

Furthermore, in accordance with one or more aspects of the present invention, because filter members may be moved continuously in directions substantially transverse to optical paths, it is possible to quickly and precisely adjust illuminance distributions in directions substantially transverse to optical paths.

Figure 1:
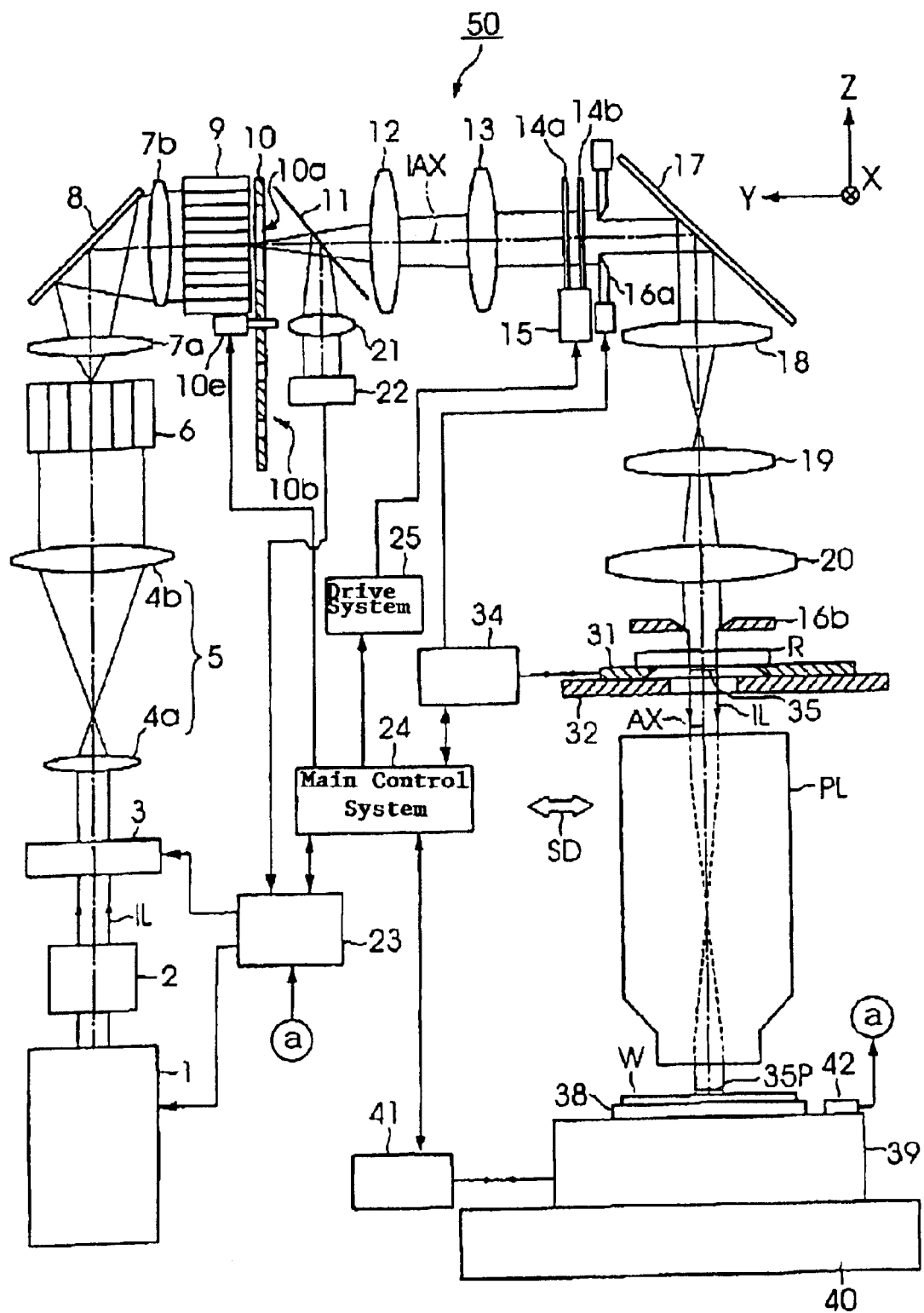
FIG. 1 is a schematic drawing showing the overall constitution of an exposure apparatus in accordance with an embodiment of the present invention.

Referring to the drawings, an illumination optical system, exposure apparatus, and microdevice manufacturing method in accordance with one or more embodiments of the present invention will be described in detail. FIG. 1 is a schematic drawing showing the overall constitution of an exposure apparatus in accordance with one or more embodiments of the present invention. The present embodiment will be described in terms of an example wherein the present invention is applied to a step-and-scan exposure apparatus as shown in FIG. 1, which may carry out manufacture of semiconductor elements by transferring a pattern formed on a reticle R serving as a mask to a wafer W serving as a substrate, as the reticle R and the wafer W are made to move relative to a projection optical system PL.

Note that in the description that follows we have chosen an orthogonal coordinate system XYZ as shown in FIG. 1, description of the positional relationship among the various elements being made with reference to this orthogonal coordinate system XYZ. This orthogonal coordinate system XYZ is oriented such that the X and Y axes are parallel to wafer W, with the Z axis being perpendicular to wafer W. The orthogonal coordinate system XYZ of the drawing is furthermore oriented such that the XY plane is in fact horizontal and the Z axis extends vertically upward therefrom. Furthermore, in the present embodiment, the direction in which the reticle R and the wafer W are made to move (i.e., the scan direction SD) is set so as to be the Y direction.

An ArF excimer laser light source (wavelength 193 nm) outputting radiation for exposure IL (hereinafter "actinic light" but extending to any mechanism or process by which such radiation might transfer an image, latent or otherwise, from mask to wafer, and to any mechanism or process for making such an image, if latent, manifest, without necessarily implying, except where specifically stated, any limitation as to wavelength of radiation employed or mechanism or process by which such image might be made manifest, whether as result of chemical, physical, or other action) in the form of a collimated beam having more or less rectangular cross section may be used as exposure light source 1 (hereinafter "actinic light source" but, as above, without limitation as to wavelength or mechanism of exposure and/or transfer) shown in FIG. 1. Actinic light IL in the form of an actinic beam comprising pulsed ultraviolet light of wavelength 193 nm from actinic light source 1 may pass through beam matching unit ("BMU") 2 and be incident on variable attenuator 3 serving as optical attenuator. Exposure control unit 23 for controlling exposure dose at photoresist on wafer W may control initiation and termination of emission of light from actinic light source 1, as well as the output thereof (e.g., oscillation frequency and/or pulse energy), and may adjust attenuation at variable attenuator 3 in stepwise and/or continuous fashion.

After passing through variable attenuator 3, if present, actinic light IL may pass through beam-forming system 5 comprising lens systems 4a and 4b and be incident on first fly's eye lens 6 serving as first-stage optical integrator (a.k.a. "uniformizer" or "homogenizer"). Actinic light IL exiting this first fly's eye lens 6, if present, may be incident, by way of first lens system 7a, optical path folding mirror 8, and second lens system 7b, on second fly's eye lens 9 serving as second-stage optical integrator.

Aperture stop carousel 10, which if present may be capable of being rotated by drive motor 10e, may be arranged at the output face of second fly's eye lens 9 (illumination system pupil plane), if present. The output face represents an optical Fourier transform plane with respect to the plane containing the pattern on reticle R which is to be transferred. Arranged at aperture stop carousel 10 so as to permit selection thereof, there may be a circular aperture stop 10a for conventional illumination, an aperture stop 10b for annular illumination, an aperture stop (not shown) comprising multiple (e.g., quadrupole) eccentric subapertures for off-axis illumination, a small circular aperture stop (not shown) for achieving low coherence factor (low σ), and so forth. Main control system 24, which if present may provide overall control of operation of the entire exposure apparatus 50, may cause rotation of aperture stop carousel 10, if present, by way of drive motor 10e, thus at least partially setting illumination conditions.

Furthermore, in order to increase efficiency of utilization of actinic light IL and achieve greater illuminance (pulse energy) during off-axis illumination (annular illumination, quadrupole illumination, etc.), it is desirable that actinic light IL be shaped into a beam having more or less an annular cross section at the stage where actinic light IL is incident on second fly's eye lens 9, if present. To achieve this, first fly's eye lens 6, if present, may for example be replaced with a diffractive optical element ("DOE") comprising an aggregate multiplicity of phase gratings. Moreover, the system for changing illumination conditions is not limited to the foregoing constitution, it being possible to use a diffractive optical element together with a zoom optical system and/or a conical prism (axicon) either alone or in combination with aperture stop carousel 10, if present. Furthermore, if an internally reflecting integrator (rod integrator or the like) is used as second-stage optical integrator, it is desirable that a DOE, conical prism, polygonal prism, or the like be used to cause actinic light IL to be incident on the internally reflecting integrator obliquely with respect to the optical axis IAX of the illumination system and to vary the range of angles with which actinic light IL is incident on the input face thereof in correspondence to illumination conditions.

Referring to FIG. 1, after exiting second fly's eye lens 9, if present, and passing through aperture stop 10a for conventional illumination, actinic light IL may be incident on beam splitter 11 having high transmittance and low reflectance. Upon being reflected by beam splitter 11, if present, actinic light may be incident, by way of collecting lens 21, on integrator sensor 22 comprising an optoelectronic detector, the detection signal from integrator sensor 22 being supplied to exposure control unit 23. The relationship between the detection signal from integrator sensor 22 and the illuminance possessed by actinic light IL at the wafer W may be measured accurately beforehand and be stored in exposure control unit 23. Exposure control unit 23, if present, may be constituted so as to permit the (average) illuminance possessed by actinic light IL at the wafer W as well as the integral thereof to be monitored indirectly based on the detection signal from integrator sensor 22, if present.

Figure 2:
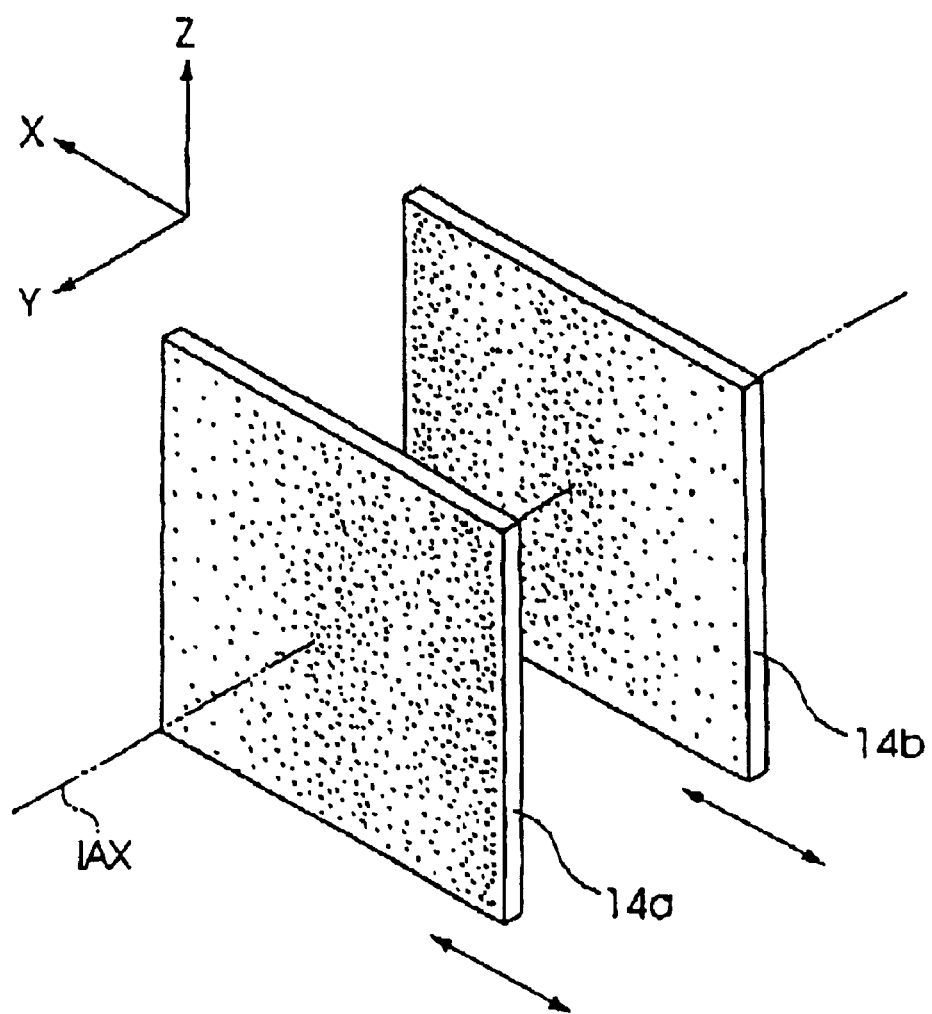
FIG. 2 is an oblique view showing the exterior of examples of filters 14a and 14b of FIG. 1.

Actinic light IL transmitted through beam splitter 11, if present, may travel along or substantially parallel to optical axis IAX, passing in order through lens systems 12 and 13, and be incident, by way of, filters 14a and 14b serving as filter members in the present invention, on movable blind (movable illumination field stop) 16a. Filters 14a and 14b may have transmittance distributions definable by functions comprising functions of order three or higher with respect to transmittance as a function of position in directions transverse to optical axis IAX. FIG. 2 is an oblique view showing the exterior of examples of filters 14a and 14b. Filters 14a and 14b shown in FIG. 2 may be such that a plurality of light-occluding dots (microdots) are vapor deposited in a prescribed pattern on stock which is substantially transparent with respect to actinic light IL. The probability of existence of patterned dots per unit area on the transparent stock is set so as to correspond to transmittance based on location on the transparent stock.

This pattern of dots formed by vapor deposition may for example be a pattern of tiny circles of diameter on the order of 25μ, and if for example illuminance distribution is to be adjusted by altering illuminance by on the order of 10% then the probability of existence of such patterned dots might range between for example 0% to 15%. Furthermore, it is desirable that there be no particular order to the arrayal of patterned dots formed on filters 14a and 14b (i.e., that locations having identical transmittances on the respective filter members not have identical arrayal of dots); or where there is a particular order, it is desirable that such particular order differ from filter 14a to filter 14b.

Furthermore, filters 14a and 14b shown in FIG. 2 may have transmittance distributions definable by third-order functions with respect to transmittance as a function of position in the X direction, the X direction being transverse to a direction (Z direction) corresponding to the scan direction SD (see FIG. 1). As used herein, "direction corresponding to scan direction SD" refers to a direction substantially identical with or substantially parallel to a projection of the scan direction onto filters 14a and 14b by the portion of the optical system between reticle R and filters 14a and 14b, inclusive.

Referring to FIG. 1, the assembly may be constructed such that drive apparatus 15 can move filters 14a and 14b continuously in the X direction, such that the positions of filters 14a and 14b in the X direction can be set separately, and such that filters 14a and 14b can be moved in translational fashion in the X direction without disturbing the positional relationship between filters 14a and 14b. Operation of this drive apparatus 15, if present, may be controlled by main control system 24 by way of drive system 25, such main control system 24 serving as control apparatus in the present invention.

With continued reference to FIG. 1, movable blind 16a may be disposed in a plane conjugate with respect to the plane in which the pattern is formed on reticle R (hereinafter "reticle plane"). Filters 14a and 14b are arranged in planes offset by prescribed amounts in the optical axis IAX direction from that conjugate plane so as to be defocused with respect thereto. Where filters 14a and 14b are defocused in this way with respect to such a plane conjugate with respect to the reticle plane, the rationale for doing so is as follows. As described above, filters 14a and 14b of the present embodiment contain formed thereon a multiplicity of patterned dots, and where such defocusing is carried out it might be done to prevent these patterned dots from being resolved at the reticle plane (which is optically conjugate to the surface of the wafer W that is being exposed), or in other words to prevent such dot pattern from being transferred to wafer W. Furthermore, if an internally reflecting integrator (rod integrator or the like) is used as second-stage optical integrator, filters 14a and 14b might be arranged at or near the output end of such internally reflecting integrator.

During exposure, actinic light IL might pass through movable blind 16a, if present, and continue on by way of optical path folding mirror 17, imaging lens system 18, condenser lens 19, main condenser lens system 20, and stationary blind (stationary illumination field stop) 16b to illuminate an illuminated region (illuminated field region) 35 on a patterned surface (here, the lower surface) of reticle R serving as mask. Stationary blind 16b, if present, may have, as disclosed for example in Japanese Patent Application Publication Kokai No. H4-196513 (1992) or in corresponding U.S. Pat. No. 5,473,410, a linear slit-like or rectangular (hereinafter collectively "slit-like") aperture arranged so as to extend in a direction perpendicular to the direction of scanned exposure at the center of a circular field of projection optical system PL, described below.

Such a movable blind 16a may be employed to vary the width in the scan direction of the illuminated field region so as to prevent unwanted or unnecessary exposure of wafer W at the beginning and end of scanned exposure at each step-and-scan "step." Alternatively or in addition thereto, such a movable blind 16a may be employed to vary the size of the patterned region which is illuminated on reticle R in a direction (cross-scan direction) perpendicular to the scan direction, or to vary the width thereof in correspondence to evaluative criteria as described in further detail below. Information concerning the numerical aperture of movable blind 16a, if present, may also be supplied to exposure control unit 23, if present. The actual value of the illuminance at the wafer W is the product of this numerical aperture and a value obtainable from the detection signal from integrator sensor 22, if present.

Furthermore, the foregoing actinic light source 1, beam matching unit 2, variable attenuator 3, beam-forming system 5 comprising lens systems 4a and 4b, first fly's eye lens 6, first lens system 7a, optical path folding mirror 8, second lens system 7b, second fly's eye lens 9, aperture stop carousel 10, beam splitter 11, lens systems 12 and 13, filters 14a and 14b, movable blind 16a, optical path folding mirror 17, imaging lens system 18, condenser lens 19, main condenser lens system 20, and stationary blind 16b may constitute an illumination optical system. Furthermore, stationary blind 16b, if present, may alternatively be arranged in a plane between movable blind 16a, if present, and filter 14b, or in a plane in or near the exit side of movable blind 16a, if present (between movable blind 16a, if present, and optical path folding mirror 17, if present).

Furthermore, fluorite (calcium fluoride; $CaF_2$) may for example be employed as glass material at beam-forming system 5 comprising lens systems 4a and 4b, first fly's eye lens 6, first lens system 7a, second lens system 7b, second fly's eye lens 9, lens systems 12 and 13, filters 14a and 14b, imaging lens system 18, condenser lens 19, and/or main condenser lens system 20 in the foregoing illumination optical system.

Actinic light IL may, by way of double telecentric projection optical system PL, transfer an image of a circuit pattern within illuminated region 35 on reticle R at prescribed projected magnification β (β being for example ¼, ⅕ or the like) to slit-like exposure region 35P at a photoresist layer on wafer W serving as substrate and arranged at the image plane of projection optical system PL. Whereas the projection optical system PL employed in the present embodiment is a dioptric (refractive) system, a catadioptric (containing reflective and refractive components) system or a catoptric (reflective) system may be employed in place thereof. Moreover, because the actinic light IL of the present embodiment is, in the vacuum, ultraviolet, it is subject to significant absorption by oxygen, carbon dioxide, water vapor and the like which are ordinarily present in air. To prevent this, the optical path shown in FIG. 1 from actinic light source 1 to wafer W might be supplied with a highly pure purge gas having high transmittance with respect to vacuum ultraviolet light (helium, neon, or other such rare gas, or nitrogen or other such "inert" gas). In addition, fluorite (calcium fluoride; $CaF_2$) may be employed as glass material at the refractive components present within projection optical system PL.

Referring to FIG. 1, reticle R may be held by suction to reticle stage 31, and reticle stage 31 may be mounted on reticle base 32 so as to permit constant velocity motion in the Y direction and so as to permit tilt in the X, Y, and rotational directions. The two dimensional position and angular rotation of reticle stage 31 (and/or reticle R) may be capable of being measured in real time by laser interferometer(s) within drive control unit 34. Control of scan speed and position of reticle stage 31 may be carried out by drive motors (linear motors), voice coil motors, within drive control unit 34 based on the results of such measurement and based on control information from main control system 24.

Wafer W may be held by suction to wafer stage 39 by way of wafer holder 38, and wafer stage 39 may be capable of two dimensional motion with respect to wafer base 40 in a plane parallel to the XY plane, which is parallel to the image plane of projection optical system PL. More specifically, wafer stage 39 may be capable of moving at constant speed in the Y direction with respect to wafer base 40, and may be capable of being stepped in the X and/or Y directions. Wafer stage 39 may, moreover, incorporate a Z leveling mechanism capable of controlling the position of wafer W in the Z direction ("focus position"), as well as the tilt angles thereof about the X and Y axes. Moreover, while not shown in the drawings, a multipoint autofocus sensor system comprising a projection optical system capable of projecting the image of a slit obliquely onto a plurality of measurement points at the front surface of wafer W ("wafer surface") and a light collecting optical system capable of collecting light reflected from that wafer surface and of generating focus signals in correspondence to focus positions at that plurality of measurement points may be provided alongside projection optical system PL. The focus signals may also be supplied to a focus controller within main control system 24. During scanned exposure, such focus controller within main control system 24 might drive Z leveling mechanism at wafer stage 39 continuously in autofocus fashion based on information contained in those focus signals (corresponding to focus positions). Doing so will make it possible to adjust focus such that the front surface of wafer W is aligned with the image plane of projection optical system PL.

The position of wafer stage 39 in the X and Y directions, and the tilt angles thereof about the X, Y, and Z axes may be capable of being measured in real time by laser interferometer(s) within drive control unit 41. Control of scan speed and position of wafer stage 39 may be carried out by drive motors (linear motors) within drive control unit 41 based on the results of such measurement and based on control information from main control system 24.

Main control system 24 may send various information related to respective displacement positions, displacement velocities, displacement accelerations, displacement offsets, and so forth associated with reticle stage 31 and wafer stage 39 to drive control units 34 and 41. In correspondence hereto, illuminated region 35, which is illuminated by actinic light IL, might, by way of reticle stage 31, be made to scan reticle R in the +Y direction (or −Y direction) at speed Vr. Synchronous with the scan, exposure region 35P, within which an image of the pattern from reticle R is to be transferred, might by way of wafer stage 39 be made to scan wafer W in the −Y direction (or +Y direction) at speed β·Vr (β representing the magnification with which an image is projected from reticle R to wafer W). Drive control unit 34 may control opening and closing of movable blind 16a so as to prevent unwanted or unnecessary exposure at the beginning and end of such scanned exposure. The reason that reticle R and wafer W move in opposite directions is that projection optical system PL of the present embodiment projects an inverted image.

Main control system 24 may read from an exposure database file various exposure conditions for achieving proper exposure dose during scanned exposure of the photoresist at each step-and-scan "step" on wafer W, and may work in conjunction with exposure control unit 23 so as to execute an optimum exposure sequence. More specifically, a command to begin scanned exposure of a region on wafer W corresponding to a step-and-scan "step" might be sent from main control system 24 to exposure control unit 23 upon which exposure control unit 23 might cause initiation of emission of light from actinic light source 1 and might, by way of integrator sensor 22, calculate a value for the integral of the illuminance possessed by actinic light IL at the wafer W (sum of pulse energy per unit time). The value of this integral might be reset to zero at the beginning of scanned exposure. In addition, exposure control unit 23 might calculate successive values for the integral of such illuminance, and might, based on the results thereof, control output (oscillation frequency and/or pulse energy) at actinic light source 1 and attenuation at variable beam attenuator 3 so as to obtain proper exposure dose at each location of the photoresist on wafer W as a result of scanned exposure. Emission of light from actinic light source 1 might then be terminated when the end of scanned exposure of the region corresponding to that step-and-scan "step" is reached.

Moreover, in the exposure apparatus of the present embodiment, an illuminance measurement unit 42 for measuring nonuniformity in illuminance possessed by actinic light IL which irradiates wafer W by way of projection optical system PL may be secured to wafer stage 39. Furthermore, CCD-type line sensor 42a (see FIG. 3(a)) having an elongated slit-like light collecting region extending in the scan direction SD (Y direction) may be secured to the top surface of such an illuminance measurement unit 42. Detection signal(s) from such a line sensor 42a may be supplied to exposure control unit 23. Moreover, where such an illuminance measurement unit 42 is employed, a standard illuminance nonuniformity sensor, not shown, comprising at least one optoelectronic sensor having pinhole-type light collecting regions may be secured to the top surface thereof.

Figure 3:
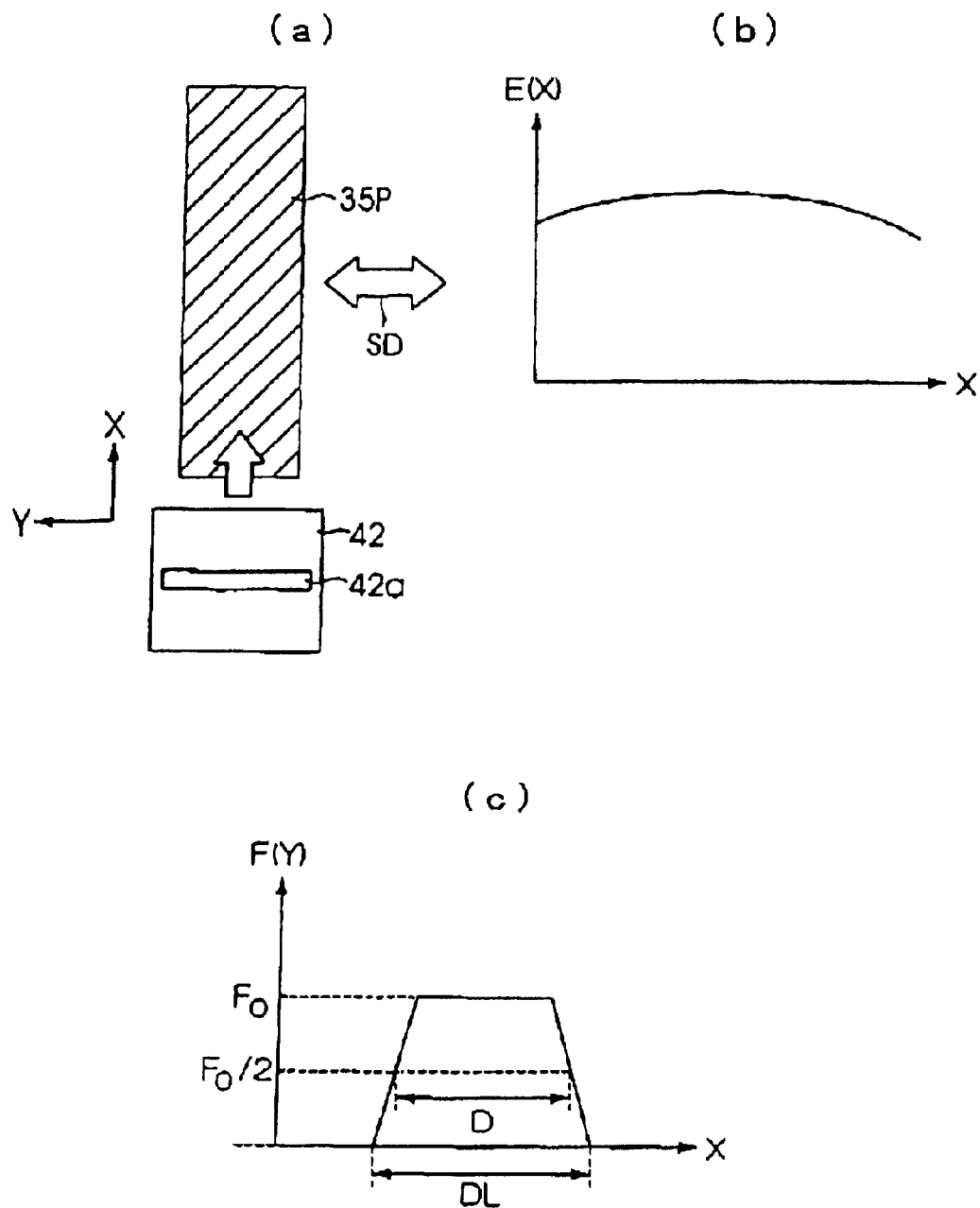
FIG. 3(a) is a drawing to assist in describing measurement of illuminance nonuniformity.
FIG. 3(b) is a drawing to assist in describing measurement of illuminance nonuniformity.
FIG. 3(c) is a drawing to assist in describing measurement of illuminance nonuniformity.

Referring to FIG. 3, a method for using such a line sensor 42a to measure illuminance nonuniformity in for example the cross-scan direction (X direction) within slit-like exposure region 35P will now be described. Note that such measurement of nonuniformity in illuminance may for example be carried out at regular intervals. At such a time, aperture stop carousel 10 shown in FIG. 1 might be driven to select conventional illumination, off-axis illumination, low σ illumination, and so forth, with measurement of nonuniformity in illuminance being carried out for each type of illumination. In addition, the change in illuminance nonuniformity occurring with increasing number of hours of operation of that exposure apparatus might be stored in a storage unit within main control system 24 in the form of tables listing data separately for different types of illumination.

FIG. 3 contains drawings to assist in describing measurement of illuminance nonuniformity. Turning first to FIG. 3(a), this shows movement of line sensor 42a on illuminance measurement unit 42 alongside the cross-scan direction of exposure region 35P of projection optical system PL when wafer stage 39 in FIG. 1 is driven. Here we can assume that the illuminance distribution F(Y) of this exposure region 35P in the scan direction SD (Y direction) presents a more or less trapezoidal shape when graphed. Taking the width in the scan direction of the base of that trapezoidal illuminance distribution F(Y) shown in FIG. 3(c) to be DL, the width in the scan direction of a light collecting region of line sensor 42a might be made sufficiently wider than DL.

Furthermore, wafer stage 39 might be driven such that, as shown in FIG. 3(a), line sensor 42a sequentially moves to each of a series of measurement points laid out at prescribed intervals in the cross-scan direction (X direction) while completely covering exposure region 35P in the scan direction. In addition, actinic light source 1 of FIG. 1 might, at each such measurement point, be made to emit pulsed light. The detection signal from integrator sensor 22 and the detection signal from line sensor 42a might be fed in parallel to exposure control unit 23, and an illuminance distribution E(X) in the cross-scan direction (X direction) at slit-like exposure region 35P might, as shown in FIG. 3(b), be calculated by dividing data obtained by integrating over all pixels the digital data obtained from the detection signal from line sensor 42a by digital data obtained from the detection signal from integrator sensor 22. The reason for dividing by digital data obtained from the detection signal from integrator sensor 22 is to eliminate the effect of variation in pulse energy. By scanning line sensor 42a in the X direction, it is thus possible to easily and quickly measure illuminance distribution E(X) in the cross-scan direction in slit-like exposure region 35P. Note that such illuminance distribution E(X) may be expressed in terms of relative values normalized for example with respect to illuminance measured at the first measurement point at either end in the cross-scan direction.

Illuminance distribution E(X) would then represent the illuminance within exposure region 35P, as integrated over the scan direction (Y direction) when measured at respective positions X in the cross-scan direction. During scanned exposure, because respective points on wafer W run in the scan direction so as to cross through the trapezoidal region of illuminance distribution F(Y) shown in FIG. 3(c), illuminance distribution E(X) in the cross-scan direction of the present example is more or less equivalent to the distribution of the integral of exposure dose in the cross-scan direction within each step-and-scan "step" on wafer W. A method for adjusting illuminance nonuniformity is described in detail below.

Figure 4:
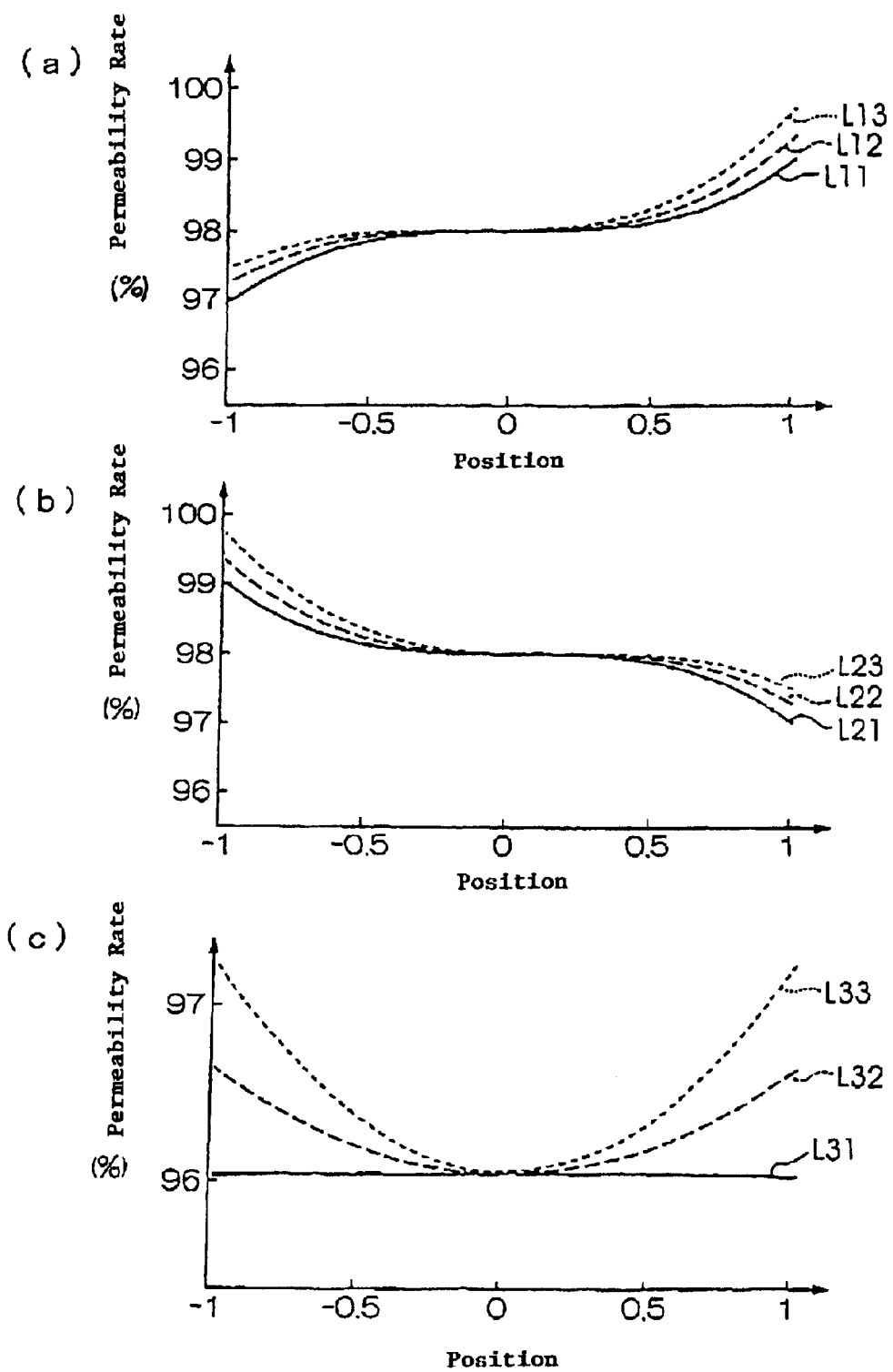
FIG. 4(a) shows the transmittance distribution of filter 14a in simulations in which transmittance distribution was varied by varying the relative positions of filters 14a and 14b.
FIG. 4(b) shows the transmittance distribution of filter 14b in simulations in which transmittance distribution was varied by varying the relative positions of filters 14a and 14b.
FIG. 4(c) shows the combined transmittance distribution produced by filters 14a and 14b in simulations in which transmittance distribution was varied by varying the relative positions of filters 14a and 14b.

FIG. 4 shows results of simulations in which transmittance distribution was varied by varying the relative positions of filters 14a and 14b. FIG. 4(a) indicates the transmittance distribution of filter 14a. FIG. 4(b) indicates the transmittance distribution of filter 14b, and FIG. 4(c) indicates the combined transmittance distribution produced by filters 14a and 14b. Transmittance distribution T10 of filter 14a shown in FIG. 4(a) is given by $T10=a \cdot X^3 + 0.98$ when the shift in the X direction is 0, and transmittance distribution T11 of filter 14b shown in FIG. 4(b) is given by $T11=-a \cdot X^3 + 0.98$ when the shift in the X direction is 0. Note that "a" appearing in the foregoing formulas represents an arbitrary constant. Filters 14a and 14b may thus be arranged so as to have respective transmittance distributions in more or less mutually inverse relationship with respect to transmittance as a function of position in a direction parallel to optical axis IAX.

Moreover, in FIG. 4(a), the curve labeled L11 indicates transmittance distribution of filter 14a when the shift in the X direction is 0. The curve labeled L12 indicates transmittance distribution of filter 14a when shift in the X direction is –0.1. And the curve labeled L13 indicates transmittance distribution of filter 14a when shift in the X direction is –0.2. Similarly, at FIG. 4(b), the curve labeled L21 indicates transmittance distribution of filter 14b when shift in the X direction is 0, the curve labeled L22 indicates transmittance distribution of filter 14b when shift in the X direction is 0.1, and the curve labeled L23 indicates transmittance distribution of filter 14b when shift in the X direction is 0.2. Note that the curves shown in FIG. 4 were drawn using a suitable value for the constant "a" which appears in the foregoing formulas for transmittance distributions T10 and T11.

At FIG. 4(c), the curve labeled L31 indicates the combined transmittance distribution produced by filters 14a and 14b when shift of filters 14a and 14b in the X direction is 0. As is clear from FIG. 4(c), the combined transmittance distribution produced by filters 14a and 14b is more or less constant (closer examination would reveal it not to be exactly constant) when shift of filters 14a and 14b in the X direction is 0 (i.e., the amount by which filters 14a and 14b are displaced with respect to each other is 0). Moreover, at FIG. 4(c), the curve labeled L32 indicates the combined transmittance distribution produced by filters 14a and 14b when shift of filter 14a in the X direction is –0.1 and shift of filter 14b in the X direction is 0.1, at which time the amount by which filters 14a and 14b are displaced with respect to each other in the X direction is 0.2. It can be seen that the combined transmittance distribution produced by filters 14a and 14b at such a time corresponds to a distribution which varies after the fashion of a second-order function in the X direction.

Moreover, at FIG. 4(c), the curve labeled L33 indicates the combined transmittance distribution produced by filters 14a and 14b when shift of filter 14a in the X direction is –0.2 and shift of filter 14b in the X direction is 0.2, at which time the amount by which filters 14a and 14b are displaced with respect to each other in the X direction is 0.4. While it can be seen that the combined transmittance distribution produced by filters 14a and 14b at such a time corresponds to a distribution which varies after the fashion of a second-order function in the X direction, as was the case with the transmittance distribution indicated by the curve labeled L32, the radius of curvature thereof is smaller than that of curve L32. It is thus possible to use filters 14a and 14b of the present embodiment to arbitrarily vary the degree to which such transmittance distribution varies after the fashion of a second-order function (i.e., it is possible to vary the curvature of such second-order function) by employing an appropriately large shift in the –X direction for filter 14a and employing an appropriately large shift in the X direction for filter 14b so as to achieve an appropriately large amount by which filters 14a and 14b are displaced with respect to each other.

Moreover, as is clear from FIG. 4(c), when the amount by which filters 14a and 14b are displaced with respect to each other in the X direction is varied, there is only a small change in the offset which is produced as a secondary effect thereof. Nonetheless, where it is desired that the exposure dose resulting from irradiation of wafer W by actinic light IL be more accurately controlled, it may be necessary to consider the effect of such offset. In such a case, it is preferred that the relationship between the positions of filters 14a and 14b in the X direction and the change in illuminance resulting from irradiation of wafer W by actinic light IL be measured in advance using for example line sensor 42a on illuminance measurement unit 42 and that illuminance due to actinic light IL be controlled at the time of exposure in correspondence to the positions of filters 14a and 14b in the X direction.

In order to use filters 14a and 14b, producing transmittance capable of being varied after the fashion of a second-order function as described above, to correct (adjust) second-order components of illuminance distributions, the relationship between shift of filters 14a and 14b in the X and/or –X directions and the change in transmittance distribution (e.g., change in curvature of corresponding second-order function) might first be determined in advance. In addition, main control system 24 might calculate shifts permitting correction of an illuminance distribution (see FIG. 3(b)) in the cross-scan direction (X direction) previously measured using line sensor 42a (i.e., so as to permit a uniform distribution to be obtained), and main control system 24 might, based on such calculated shifts, cause drive apparatus 15 to be driven by way of drive system 25 so as to position filters 14a and/or 14b in the X and/or –X directions.

Alternatively, wafer stage 39 might be driven such that, as shown in FIG. 3(a), line sensor 42a on illuminance measurement unit 42 is made to move alongside the cross-scan direction of exposure region 35P such that line sensor 42a sequentially moves to each of a series of measurement points laid out at prescribed intervals in the cross-scan direction (X direction) while completely covering exposure region 35P in the scan direction. In addition, actinic light source 1 of FIG. 1 might, at each such measurement point, be made to emit pulsed light and the detection signal from line sensor 42a at times when actinic light IL irradiates exposure region 35P by way of filters 14a and 14b might sequentially be captured. In the event that the value of the detection signal measured at these respective measurement points is not constant, filters 14a and/or 14b might be moved by prescribed amounts in the X and/or –X directions and the results of measurement at such respective measurement points again evaluated. By thus measuring the illuminance distribution in the cross-scan direction during actual irradiation of exposure region 35P by actinic light IL while varying the positions of filters 14a and/or 14b in the X and/or –X directions, it is possible to determine positions of filters 14a and/or 14b for which nonuniformity in the illuminance distribution in the cross-scan direction disappears (i.e., for which illuminance is constant in the cross-scan direction).

A step-and-scan exposure apparatus as described in the foregoing embodiment may employ actinic light in the form of a beam having a cross section in the shape of a slit oriented such that the long direction thereof is parallel to the cross-scan direction. Reticles R and wafers W may be scanned relative to such actinic light to sequentially transfer patterns formed on reticles R to regions exposed on wafers W during such step-and-scan "steps." Thus, even if there were nonuniformity in the illuminance distribution of actinic light IL in the scan direction, because the exposure dose produced by irradiation of wafer W by actinic light IL corresponds to the integral of the illuminance distribution in the scan direction, nonuniformity of the illuminance distribution of actinic light IL in the scan direction presents little problem.

However, in a step-and-repeat exposure apparatus exposure of the region corresponding to that step-and-repeat "step" is carried out all at once without alteration of such positioning (i.e., without scanning). In this type of exposure apparatus, it is not sufficient, as is the case with a step-and-scan exposure apparatus, to correct nonuniformity of the illuminance distribution in merely one direction (cross-scan direction). Instead, the illuminance distribution must be made uniform over the entire surface of the step-and-repeat "step" on wafer W (i.e., the entire region being exposed). For this reason, an illumination optical system present in such a step-and-repeat exposure apparatus might be equipped with two or more filter members having transmittance distributions definable by functions comprising functions of order three or higher with respect to transmittance as a function of position in respectively a first direction (e.g., the X direction in FIG. 1) which is transverse to an optical path of actinic light emitted from an actinic light source and a second direction (e.g., the Y direction in FIG. 1) which is perpendicular to such first direction.

An illumination optical system provided with such filters may also be provided with at least one drive apparatus capable of moving one or more of such filters continuously in such first direction and/or such second direction, as is the case with the illumination optical system shown in FIG. 1. Such drive apparatus may be controlled by an apparatus systems similar to main control system 24 and drive system 25 shown in FIG. 1. Such an arrangement will allow relative positions of respective filters to be controlled by such a main control system 24. Moreover, as is the case with the illumination optical system provided in the step-and-scan exposure apparatus shown in FIG. 1, an illumination optical system provided in such a step-and-repeat exposure apparatus may employ field stops capable of defining regions on reticles R to be illuminated by actinic light IL in planes optically conjugate to the reticle planes of reticles R, and one or more of such filters may be arranged near such field stops. In other words, such filters may be arranged near planes optically conjugate to reticle planes of reticles R. Note that where such field stops is arranged near such reticles R, such filters may be arranged in or near planes optically conjugate to planes containing such reticles.

Figure 5:
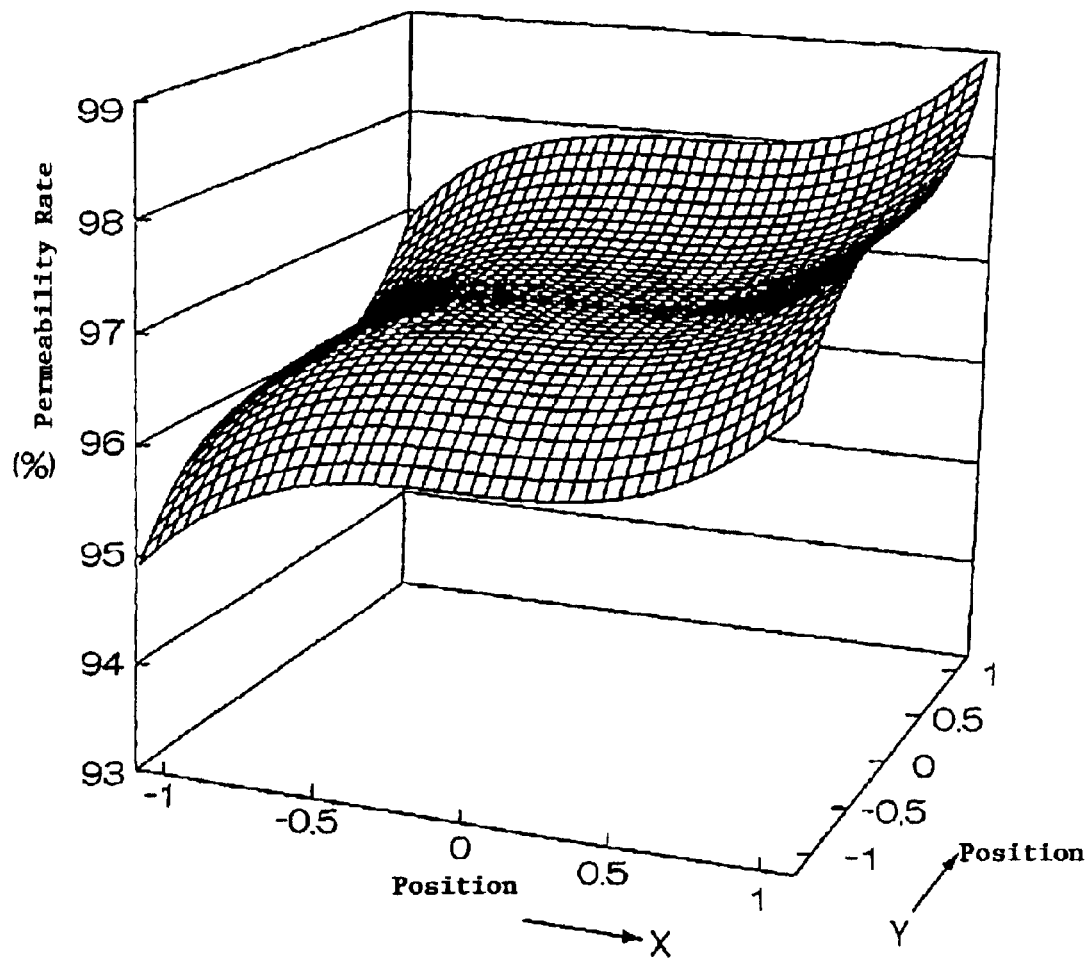
FIG. 5 shows a graph of a transmittance distribution possessed by a filter, this transmittance distribution being definable by functions comprising functions of order three or higher with respect to transmittance as a function of position in respectively a first direction which is transverse to an optical path of actinic light and a second direction which is perpendicular to such first direction.

FIG. 5 shows an example of a graph of a transmittance distribution possessed by a filter. The transmittance distribution is definable by functions comprising functions of order three or higher with respect to transmittance as a function of position in respectively a first direction which is transverse to an optical path of actinic light and a second direction which is perpendicular to such first direction. Note that in FIG. 5 the first direction is taken to be the X direction, and the second direction is taken to be the Y direction. Transmittance distribution T20 of the filter shown in FIG. 5 is given by $T20 = b \cdot X^3 + c \cdot Y^3 + 0.97$ when shift in the X and Y directions is 0. Note that b and c appearing in the foregoing formulas represent arbitrary constants.

Figure 6:
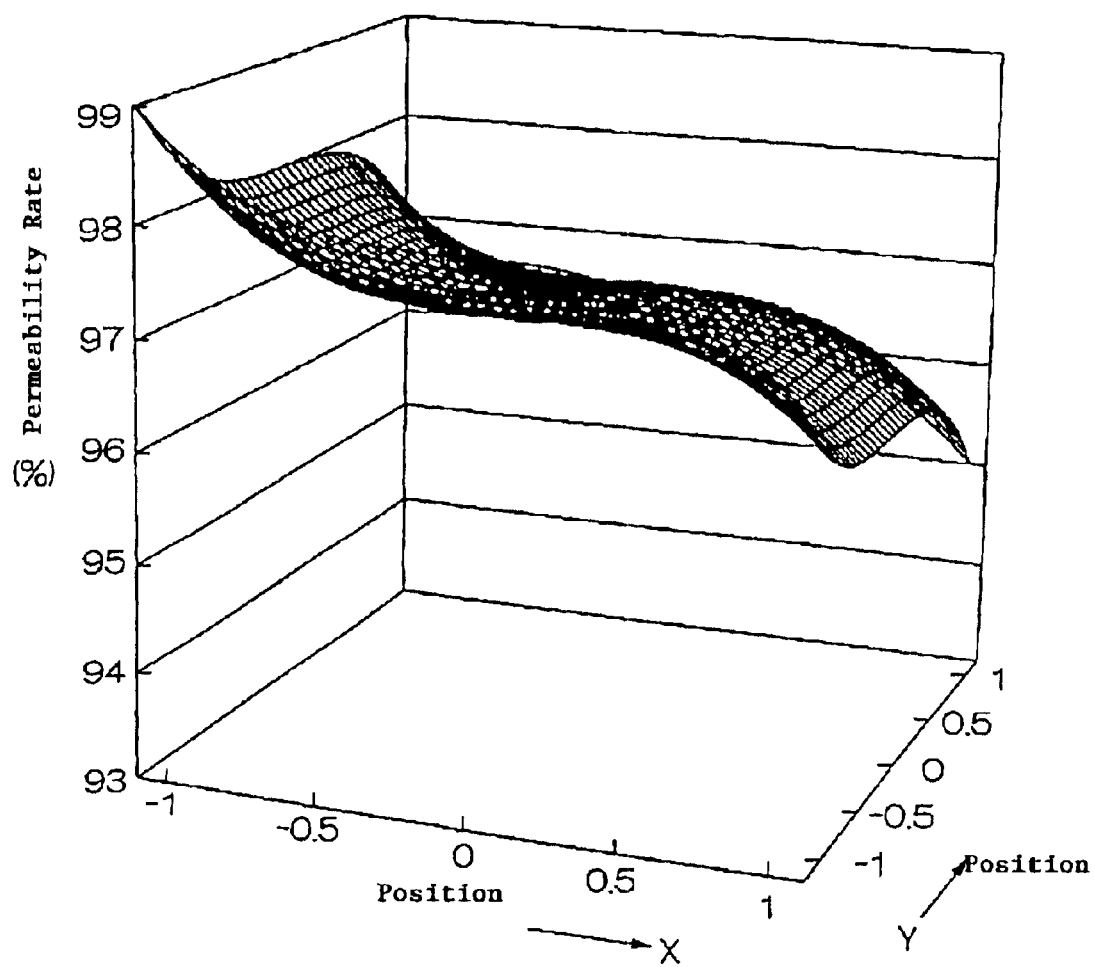
FIG. 6 shows a graph of a transmittance distribution possessed by a filter other than the filter having transmittance distribution as shown in FIG. 5.

FIG. 6 shows an example of a graph of a transmittance distribution possessed by a filter other than the filter having transmittance distribution as shown in FIG. 5. Transmittance distribution T21 of the filter shown in FIG. 6 is given by $T21 = -b \cdot X^3 - c \cdot Y^3 + 0.97$ when shift in the X and Y directions is 0. Two filters provided in a step-and-repeat exposure apparatus may thus likewise be arranged so as to have respective transmittance distributions in more or less mutually inverse relationship with respect to transmittance in a direction parallel to the direction in which actinic light progresses therethrough (i.e., parallel to the optical axis).

Figure 7:
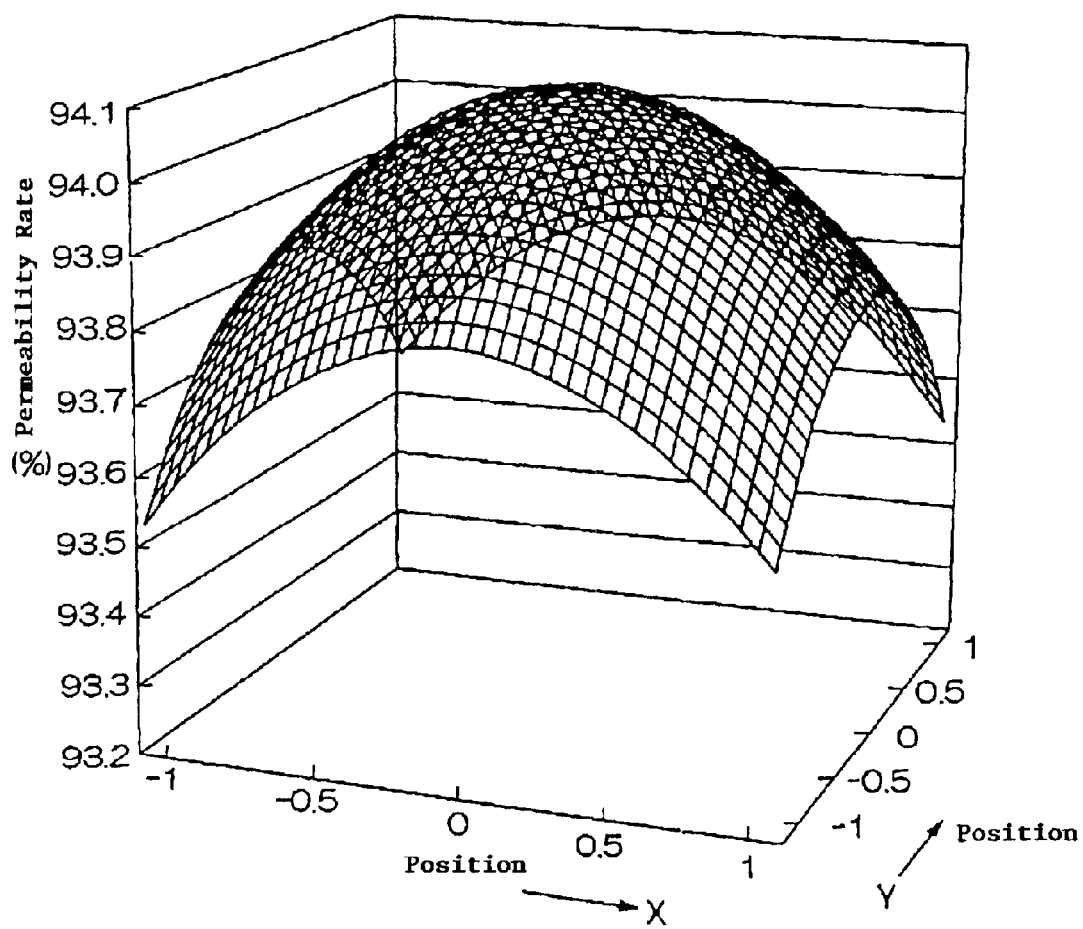
FIG. 7 shows the combined transmittance distribution produced by the filters whose transmittance distributions are shown in FIGS. 5 and 6, but here the shift of the filter having transmittance distribution as shown in FIG. 5 is 0.1 in the X and Y directions, and the shift of the filter having transmittance distribution as shown in FIG. 6 is −0.1 in the X and Y directions.

FIG. 7 shows the combined transmittance distribution produced by the filters whose transmittance distributions are shown in FIGS. 5 and 6. But in FIG. 7, the shift of the filter has a transmittance distribution as shown in FIG. 5 is 0.1 in the X and Y directions, and the shift of the filter having transmittance distribution as shown in FIG. 6 is –0.1 in the X and Y directions. Note that the curves shown in FIG. 7 were drawn using suitable values for the constants b and c which appear in the foregoing formulas for transmittance distributions T20 and T21. As can be seen from FIG. 7, the combined transmittance distribution produced by the two filters corresponds to a distribution which varies after the fashion of second-order functions in both the X and Y directions, the shape of the curve being convex upward in both the X and Y directions.

Figure 8:
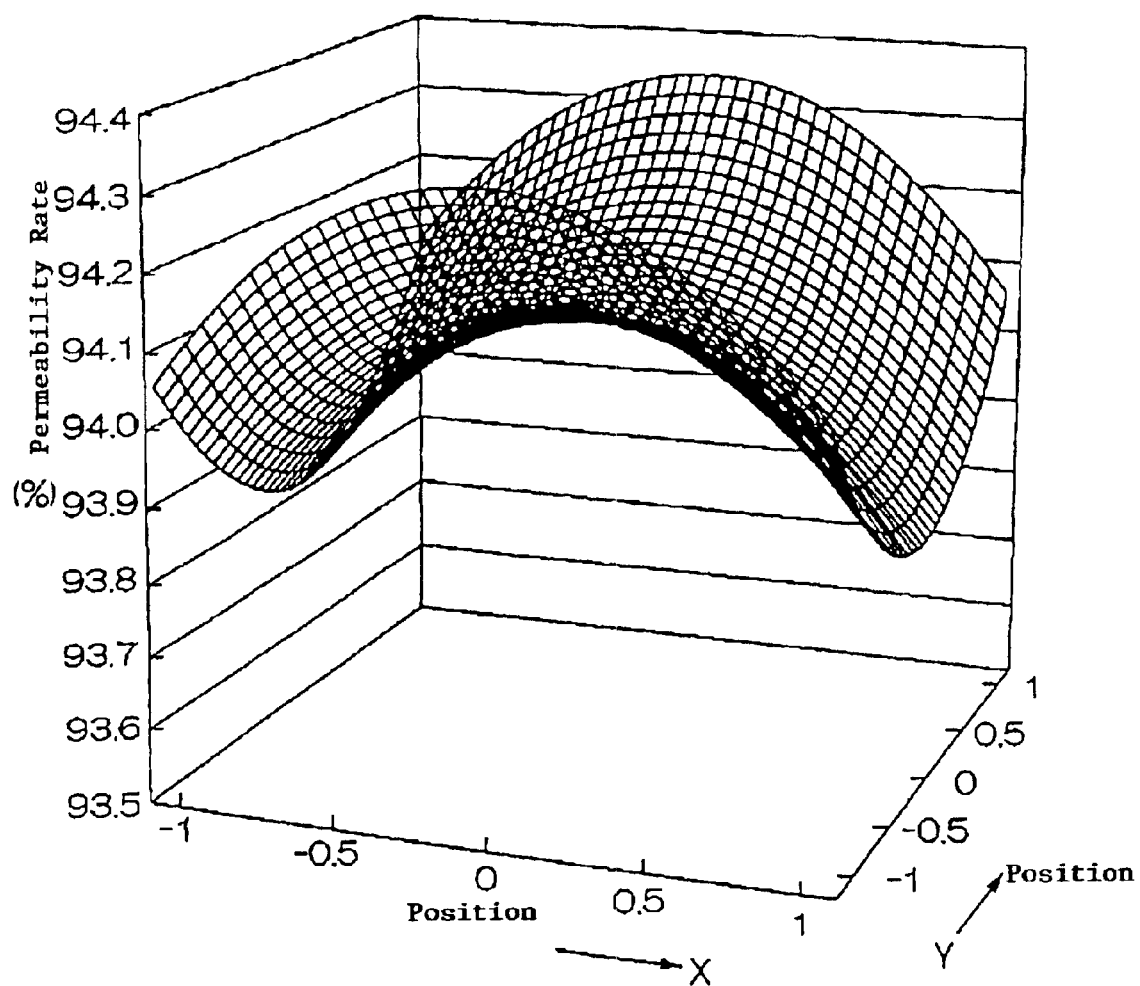
FIG. 8 shows the combined transmittance distribution produced by the filters whose transmittance distributions are shown in FIGS. 5 and 6, but here the shift of the filter having transmittance distribution as shown in FIG. 5 is 0.1 in the X direction and −0.1 in the Y direction, and the shift of the filter having transmittance distribution as shown in FIG. 6 is −0.1 in the X direction and 0.1 in the Y direction.

Furthermore, FIG. 8 shows the combined transmittance distribution produced by the filters whose transmittance distributions are shown in FIGS. 5 and 6, but here the shift of the filter having transmittance distribution as shown in FIG. 5 is 0.1 in the X direction and –0.1 in the Y direction, and the shift of the filter having transmittance distribution as shown in FIG. 6 is –0.1 in the X direction and 0.1 in the Y direction. While the transmittance distribution shown in FIG. 8 corresponds to a distribution which varies after the fashion of second-order functions in both the X and Y directions, unlike the transmittance distribution shown in FIG. 7 the shape of the curve here is convex upward in the X direction but convex downward in the Y direction. By thus employing a combination of filters having transmittance distributions definable by functions comprising functions of order three or higher with respect to respective transmittances in the X and Y directions and by separately setting in the X and Y directions the amounts by which the filters are displaced with respect to each other, it is possible not only to freely vary the degree to which such transmittance distributions vary after the fashion of second-order functions (i.e., varying the curvature of such second-order functions) but also to freely change the sign of the curvature thereof (i.e., making such curvature convex upward or convex downward).

Furthermore, it is clear from FIGS. 7 and 8 that when the amounts by which filters whose transmittance distributions are shown in FIGS. 5 and 6 are displaced with respect to each other in the X and Y directions are varied there is only a small change in the offset which is produced as a secondary effect thereof. Nonetheless, where it is desired that the exposure dose resulting from irradiation of wafer W by actinic light IL be more accurately controlled, it is preferred that the relationship between the positions of such two filters in the X and Y directions and the change in illuminance resulting from irradiation of wafer W by actinic light IL be measured in advance using for example line sensor 42a on illuminance measurement unit 42 and that illuminance due to actinic light IL be controlled at the time of exposure in correspondence to the positions of such two filters in the X and Y directions.

Furthermore, in order to use such two filters producing transmittances capable of being varied in the X and Y directions after the fashion of second-order functions to correct or adjust second-order components of illuminance distributions, it is possible to employ a method in which filter positions are controlled based on relationships determined in advance, as described above, between shifts and changes in transmittance distributions (e.g., change(s) in curvature of corresponding second-order functions) and/or a method in which filter positioning is carried out while measuring results of detection of actinic light which irradiates an exposure region by way of such filters. Moreover, here it is possible not only to adjust second-order components of illuminance distributions but also, through collective decentration of such filter combination taken as a whole in the X and/or Y directions, to correct first-order components of illuminance distributions.

Whereas several preferred embodiments of the present invention have been described above, these examples have been presented merely for purposes of describing the invention and it not intended that the invention should be limited thereto. he present invention may be carried out in the context of a wide variety of modes and embodiments other than those specifically presented herein.

For example, whereas the foregoing embodiments have been described in terms of examples in which an ArF excimer laser light source is used as actinic light source 1, super-high-pressure mercury lamps emitting g-line (wavelength 436 nm) and/or i-line (wavelength 365 nm) radiation; high-frequency apparatuses employing KrF excimer lasers (wavelength 248 nm), ArF excimer lasers (wavelength 193 nm), $F_2$ excimer lasers (wavelength 157 nm), $Kr_2$ lasers (wavelength 146 nm), and/or YAG lasers; and/or high-frequency apparatuses employing semiconductor lasers may also be employed as actinic light source 1.

In addition, single-line laser light in the infrared and/or visible region emitted by a DFB semiconductor laser or fiber laser might be amplified for example by a fiber amplifier doped with erbium (or with both erbium and ytterbium), a nonlinear optical crystal might be used to convert the wavelength thereof to that of ultraviolet light, and the high-frequency radiation obtained might then be employed. If the wavelength of light emitted by such single-line laser is for example within the range $1.51\mu$ to $1.59\mu$, the wavelength of the high-frequency radiation which is output might be within the range 189 nm to 199 nm, representing a change by a factor of 8; or within the range 151 nm to 159 nm, representing a change by a factor of 10.

In particular, if an oscillation wavelength within the range $1.544\mu$ to $1.553\mu$ is used, high-frequency radiation of wavelength within the range 193 nm to 194 nm might be obtained. This represents a change by a factor of 8 and constituting ultraviolet light of wavelength more or less identical to that produced by an ArF excimer laser; or if an oscillation wavelength within the range $1.57\mu$ to $1.58\mu$ is used, high-frequency radiation of wavelength within the range 157 nm to 158 nm might be obtained, representing a change by a factor of 10 and constituting ultraviolet light of wavelength more or less identical to that produced by an $F_2$ laser.

Furthermore, if an oscillation wavelength within the range $1.03\mu$ to $1.12\mu$ is used, high-frequency radiation of wavelength within the range 147 nm to 160 nm might be output. This represents a change by a factor of 7; and in particular, if an oscillation wavelength within the range $1.099\mu$ to $1.106\mu$ is used, high-frequency radiation of wavelength within the range 157 nm to 158 nm might be obtained, representing a change by a factor of 7 and constituting ultraviolet light of wavelength more or less identical to that produced by an $F_2$ laser. In such a case, an ytterbium-doped fiber laser may be employed as such single-line laser.

Furthermore, whereas the foregoing embodiments have been described in terms of examples in which fluorite (calcium fluoride; $CaF_2$) is used as glass material employed at beam-forming system 5 comprising lens systems 4a and 4b, first fly's eye lens 6, first lens system 7a, second lens system 7b, second fly's eye lens 9, lens systems 12 and 13, filters 14a and 14b, imaging lens system 18, condenser lens 19, and main condenser lens system 20 in the foregoing illumination optical system, and as the glass material employed at the refractive components present within projection optical system PL, such glass material may, depending on the wavelength of actinic light IL, more generally be selected from among fluorite (calcium fluoride; $CaF_2$), magnesium fluoride ($MgF_2$), lithium fluoride (LiF), barium fluoride ($BaF_2$), strontium fluoride ($SrF_2$), LiCAF (colquiriite; $LiCaAlF_6$), LiSAF ($LiSrAlF_6$), $LiMgAlF_6$, $LiBeAlF_6$, $KMgF_3$, $KCaF_3$, $KSrF_3$ and other such fluoride crystals as well as mixed crystals thereof, fused quartz doped with fluorine, hydrogen, and/or other such substance, and other such optical materials which transmit vacuum ultraviolet light. Note that because with fused quartz which has been doped with a prescribed substance there is a drop in transmittance with actinic light of wavelength shorter than on the order of 150 nm, when employing vacuum ultraviolet light of wavelength shorter than on the order of 150 nm as actinic light IL, fluorite (calcium fluoride), magnesium fluoride, lithium fluoride, barium fluoride, strontium fluoride, LiCAF (colquiriite), LiSAF ($LiSrAlF_6$), $LiMgAlF_6$, $LiBeAlF_6$, $KMgF_3$, $KCaF_3$, $KSrF_3$ and/or other such fluoride crystals and/or mixed crystals thereof might be employed.

Furthermore, whereas the foregoing embodiments have, to facilitate understanding, been described in terms of examples of filters having transmittance distributions varying after the fashion of third-order functions in the X (and/or Y) directions, it is also possible to employ filters having transmittance distributions alternatively or additionally containing components representable by higher-order power series and/or components representable for example by trigonometric functions and/or other such functions. Moreover, whereas the foregoing embodiments have, to facilitate understanding, been described in terms of examples of combinations of two filters having transmittance distributions varying after the fashion of third-order functions in the X (and/or Y) directions, it is also possible to employ combinations of three or more such filters. For example, independent adjustment of second-order components of illuminance distributions in the x direction and second-order components of illuminance distributions in the y direction may be easily achieved through combination of four filters respectively having the transmittance distributions Ta(x, y), Tb(x, y), Tc(x, y), and Td(x, y), below.

$$Ta(x, y) = ax^3 + d$$

$$Tb(x, y) = -ax^3 + d$$

$$Tc(x, y) = ay^3 + d$$

$$Td(x, y) = -ay^3 + d$$

Furthermore, whereas the foregoing embodiments have been described in terms of examples employing filters wherein a plurality of light-occluding patterned dots are formed by vapor deposition on transparent stock, it is also possible to prepare such filters by using optical thin films or the like, with film design parameters being varied as a function of location. In addition, any optical material whose thickness can be varied so as to permit a profile varying after the fashion of third-order functions over the surface thereof may be used as such filter stock provided only that such material displays some degree of absorption with respect to actinic light IL. In addition, where metal or ceramic is used as such filter stock, the metal or ceramic stock employed may have a multiplicity of micropores formed therein. In such a case, the foregoing transmittance distributions containing components representable by third- and/or higher-order power series may be formed by varying the probability of existence of such micropores as a function of location.

Furthermore, the present invention may be applied not only to exposure apparatuses used for manufacture of semiconductor devices, but also to exposure apparatuses capable of transferring a device pattern to a glass plate such as those used for manufacture of display devices comprising liquid crystal (LCD) elements or the like, exposure apparatuses capable of transferring a device pattern to a ceramic wafer such as those used for manufacture of thin-film magnetic heads, exposure apparatuses used for manufacture of CCDs and other such image pickup elements, and so forth. Moreover, the present invention may also be applied to exposure apparatuses capable of transferring a circuit pattern to glass stock, silicon wafer material, or the like for manufacture of reticles or masks such as are used in exposure apparatuses, EUV exposure apparatuses, x-ray exposure apparatuses, electron-beam exposure apparatuses, and the like. Here, transmission masks may generally be employed in exposure apparatuses employing DUV (far ultraviolet), VUV (vacuum ultraviolet), and the like, and fused quartz, fused quartz which has been doped with fluorine, fluorite, magnesium fluoride, quartz, or the like may be used as reticle stock. Furthermore, transmission masks (e.g., stencil masks and membrane masks) may be employed in proximity-type x-ray exposure apparatuses, electron-beam exposure apparatuses, and the like, and silicon wafer material or the like may be used as reticle stock in such case.

Figure 9:
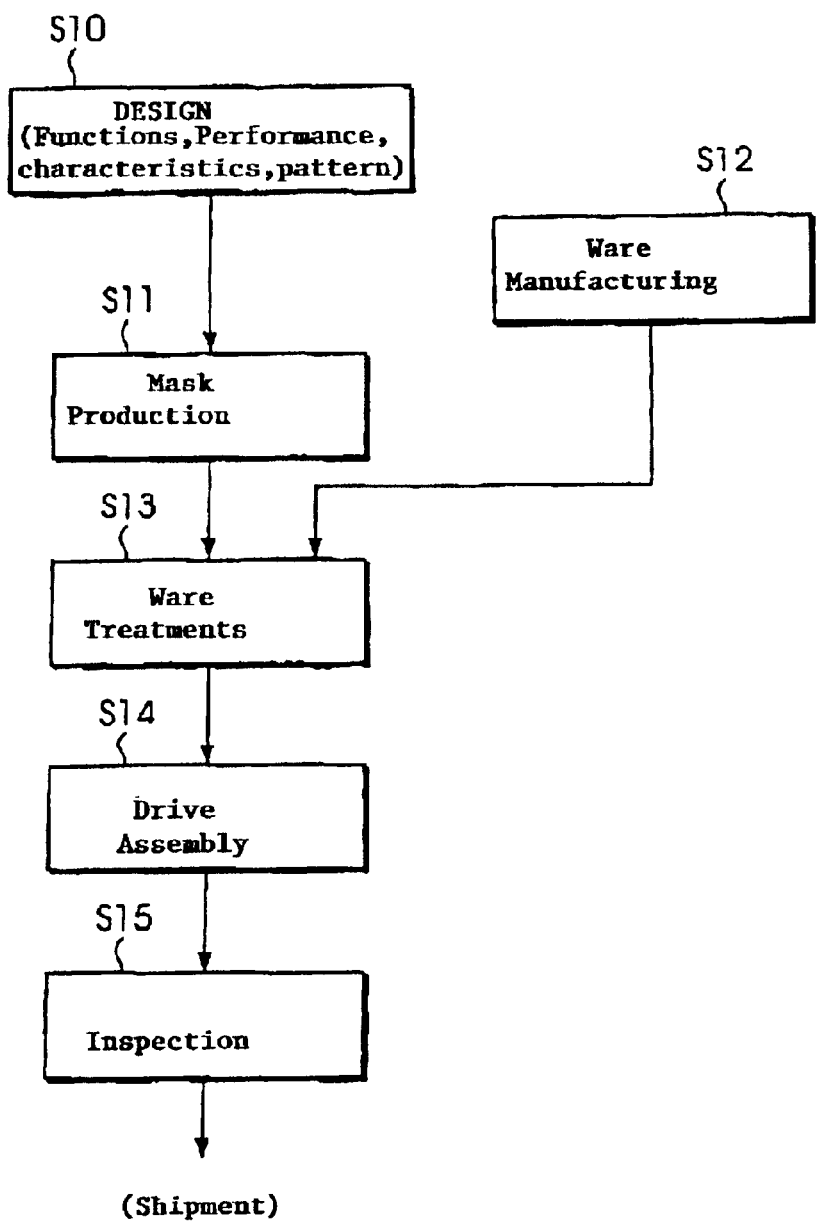
FIG. 9 is a flowchart showing an example of operations for manufacture of a microdevice.

Next, an exposure apparatus and an exposure method in accordance with one or more embodiments of the present invention will be described in terms of an embodiment of a microdevice manufacturing method utilizable in lithographic operation(s). FIG. 9 is a drawing showing a flowchart of an example of manufacture of a microdevice (IC, LSI or other such semiconductor chip, liquid crystal panel, CCD, thin-film magnetic head, micromachine, etc.). Referring to FIG. 9, at step S10 (design step), design is first carried out with respect to microdevice capabilities and characteristics (e.g., circuit design for a semiconductor device, etc.), and design of a pattern for achieving such capabilities is moreover carried out. At step S11 (mask fabrication step), a mask (reticle) is then fabricated, the circuit or other such pattern which was designed above being formed on such mask. Furthermore, at step S12 (wafer fabrication step), silicon or other such material is used to fabricate wafers.

At step S13 (wafer processing step), a mask and wafer prepared in accordance with steps S10 through S12 are then used to actually form circuitry or the like on the wafer by means of lithographic techniques as described in further detail below. At step S14 (device assembly step), a wafer processed in accordance with step S13 is then used in carrying out device assembly. This step S14 may include dicing operations, bonding operations, packaging (chip encapsulation) operations, and/or the like as necessary. Finally, at step S15 (inspection step), microdevices manufactured in accordance with step S14 is or are subjected to testing to verify operation, testing to verify endurance, and/or other such inspection procedures. Manufacture of microdevices is completed when the foregoing operations have been carried out, and microdevices so produced may thereafter be shipped.

Figure 10:
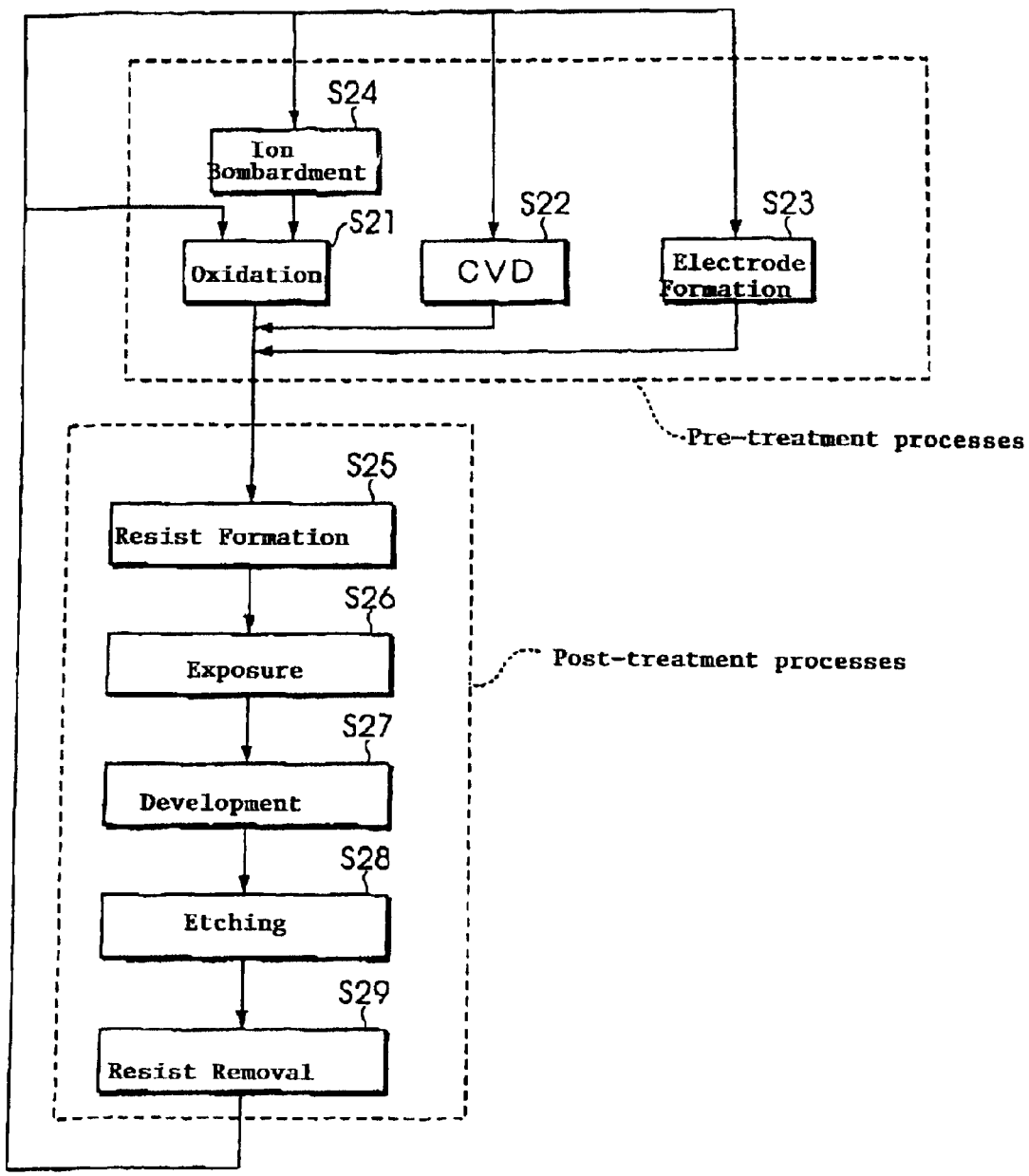
FIG. 10 is a drawing showing an example of detailed flow of operations which may take place at step S13 of FIG. 9 in the event that a semiconductor device is being manufactured.
Figure 11:
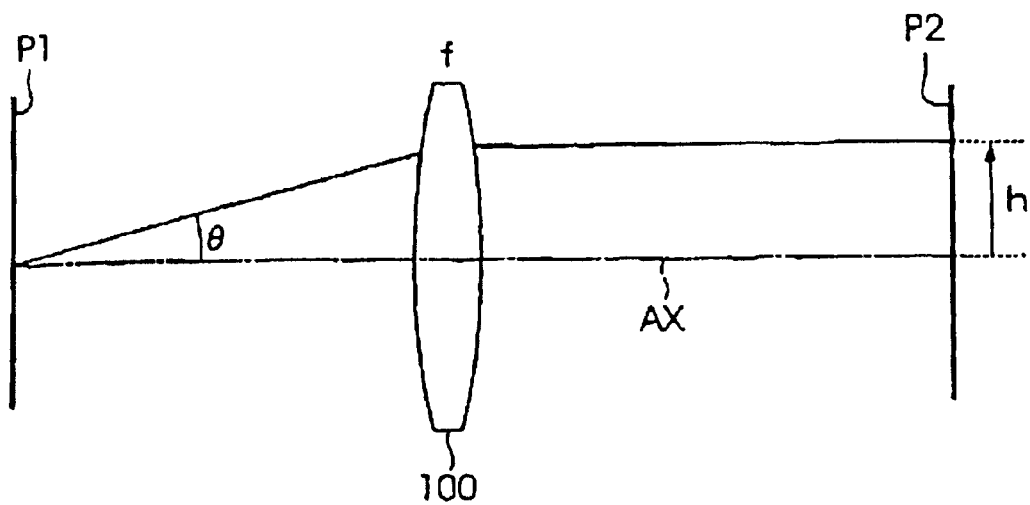
FIG. 11 is a drawing to assist in description of a principle by which an illuminance distribution might be adjusted by means of a condenser lens.

FIG. 10 is a drawing showing an example of a detailed flow of operations which might take place at step S13 of FIG. 9 in the event that a semiconductor device is being manufactured. Referring to FIG. 10, at step S21 (oxidation step), the surface of a wafer is oxidized. At step S22 (CVD step), an insulator film is formed on the wafer surface. At step S23 (electrode formation step), electrodes are formed on the wafer by means of vapor deposition. At step S24 (ion implant step), the wafer is subjected to ion implantation. The respective aforementioned steps S21 through S24 constitute preprocessing with respect to wafer processing performed at various stages, appropriate preprocessing items being selected therefrom and carried out as necessary for processing at such various stages.

During wafer processing at each such stage, postprocessing operations as described below are carried out following completion of the foregoing preprocessing operations. During such postprocessing operations, referring to step S25 (resist formation step), a wafer is first coated with a photosensitive material. At step S26 (exposure step), a circuit pattern on a mask is then transferred to the wafer by means of a lithographic system (exposure apparatus) and exposure method as described above. At step S27 (develop step), the wafer subjected to exposure is then subjected to develop, and at step S28 (etch step), etching is carried out to remove uncovered material present in regions where resist no longer remains. Furthermore, at step S29 (resist strip step), resist no longer necessary following completion of etching is removed. By carrying out such preprocessing operations and postprocessing operations in repetitive fashion, patterned circuitry is formed in multilayer fashion on the wafer.

Employment of the microdevice manufacturing method in the embodiment described above makes it possible to achieve high-yield manufacture of highly integrated devices wherein minimum linewidth is on the order of $0.1\mu$, since wafers W are exposed using actinic light IL having uniform illuminance distribution at exposure operations (step S26), permitting patterns formed on reticles R to be faithfully transferred to wafers W.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An illumination optical system for illuminating an object with light emitted from at least one light source, the illumination optical system comprising:

at least two filter members located in one or more optical paths of light emitted from the at least one light source that illuminates the object, the at least two filter members having transmittance distributions substantially definable by a function comprising the third order or higher order power series with respect to transmittance as a function of position in one or two directions substantially transverse to at least one of the one or more optical paths.

2. The illumination optical system of claim 1 further comprising at least one drive apparatus capable of moving at least one of the at least two filter members in one or two directions substantially transverse to at least one of the one or more optical paths.

3. The illumination optical system of claim 2 wherein the at least one drive apparatus is capable of moving at least one of the at least two filter members continuously in one or two directions substantially transverse to at least one of the one or more optical paths.

4. The illumination optical system of claim 2 further comprising at least one control apparatus capable of causing the at least one drive apparatus to be driven so as to permit control of a positional relationship between the at least two filter members in one or two directions substantially transverse to at least one of the one or more optical paths.

5. The illumination optical system of claim 3 further comprising at least one control apparatus capable of causing the at least one drive apparatus to be driven so as to permit control of a positional relationship between the at least two filter members in one or two directions substantially transverse to at least one of the one or more optical paths.

6. The illumination optical system of claim 1 wherein at least two of the at least two filter members are capable of being arranged so as to have respective transmittance distributions in substantially a mutually inverse relationship with respect to transmittance as a function of position in one or more directions substantially transverse to at least one of the one or more optical paths.

7. An illumination optical system for illuminating an object with light emitted from at least one light source, the illumination optical system comprising:

at least two filter members located in one or more optical paths of light emitted from the at least one light source that illuminates the object, the at least two filter members having transmittance distributions substantially definable by functions comprising the third order or higher order power series with respect to transmittance as a function of position in respectively at least a first direction which is substantially transverse to at least one of the one or more optical paths and a second direction which is substantially perpendicular to the first direction.

8. The illumination optical system of claim 7 further comprising at least one drive apparatus capable of moving at least one of the at least two filter members in a direction substantially parallel to at least one of the first and second directions.

9. The illumination optical system of claim 8 wherein the at least one drive apparatus is capable of moving at least one of the at least two filter members continuously in a direction substantially parallel to at least one of the first and second directions.

10. The illumination optical system of claim 8 further comprising at least one control apparatus capable of causing the at least one drive apparatus to be driven so as to permit control of a positional relationship between at least two of the at least two filter members in a direction substantially parallel to at least one of the first and second directions.

11. The illumination optical system of claim 9 further comprising at least one control apparatus capable of causing the at least one drive apparatus to be driven so as to permit control of a positional relationship between at least two of the at least two filter members in a direction substantially parallel to at least one of the first and second directions.

12. An illumination optical system as in one of claims 1–11 wherein at least one of the at least two filter members is capable of being arranged near the object to be illuminated and substantially in a plane optically conjugate to the object to be illuminated.

13. An illumination optical system as in one of claims 1–11 wherein at least one of the at least two filter members is capable of being arranged near the object to be illuminated or substantially in a plane optically conjugate to the object to be illuminated.

14. An exposure apparatus for illuminating a mask with light from at least one light source and transferring at least one pattern formed on the mask to a photosensitive substrate, the apparatus comprising:

a mask stage constructed so as to permit the mask to be loaded thereon;

a stage constructed so as to permit the photosensitive substrate to be loaded thereon; and an illumination optical system for illuminating the mask with light emitted from the at least one light source, wherein the illumination optical system comprises at least two filter, members located in one or more optical paths of light emitted from the at least one light source that illuminates the mask, the at least two filter members having transmittance distributions substantially definable by a function comprising the third order or higher order power series with respect to transmittance as a function of position in one or two directions substantially transverse to at least one of the one or more optical paths.

15. The exposure apparatus of claim 14 wherein at least one of the at least two filter members in the illumination optical system is capable of being arranged near the mask to be illuminated or substantially in a plane optically conjugate to a plane generally containing the mask to be illuminated.

16. The exposure apparatus of claim 14 wherein at least one of the at least two filter members in the illumination optical system is capable of being arranged near the mask to be illuminated and substantially in a plane optically conjugate to a plane generally containing the mask to be illuminated.

17. The exposure apparatus of claim 14 wherein the illumination optical system further comprises at least one drive apparatus capable of moving at least one of the at least two filter members in one or two directions substantially transverse to at least one of the one or more optical paths.

18. The exposure apparatus of claim 17 wherein the at least one drive apparatus in the illumination optical system is capable of moving at least one of the at least two filter members continuously in one or two directions substantially transverse to at least one of the one or more optical paths.

19. The exposure apparatus of claim 17 wherein the illumination optical system further comprises at least one control apparatus capable of causing the at least one drive apparatus to be driven so as to permit control of a positional relationship between the at least two filter members in one or two directions substantially transverse to at least one of the one or more optical paths.

20. The exposure apparatus of claim 18 wherein the illumination optical system further comprises at least one control apparatus capable of causing the at least one drive apparatus to be driven so as to permit control of a positional relationship between the at least two filter members in one or two directions substantially transverse to at least one of the one or more optical paths.

21. An exposure apparatus for illuminating a mask with light from at least one light source and transferring at least one pattern formed on the mask to a photosensitive substrate, the apparatus comprising:

a mask stage constructed so as to permit the mask to be loaded thereon;

a stage constructed so as to permit the photosensitive substrate to be loaded thereon; and an illumination optical system for illuminating the mask with light emitted from the at least one light source, wherein the illumination optical system comprises at least two filter members located in one or more optical paths of light emitted from the at least one light source that illuminates the mask, the at least two filter members having transmittance distributions substantially definable by a function comprising the third order or higher order power series with respect to transmittance as a function of position in respectively at least a first direction which is substantially transverse to at least one of the one or more optical paths and a second direction which is substantially perpendicular to the first direction.

22. The exposure apparatus of claim 21 wherein the illumination optical system further comprises at least one drive apparatus capable of moving at least one of the at least two filter members in a direction substantially parallel to at least one of the first and second directions.

23. The exposure apparatus of claim 22 wherein the at least one drive apparatus in the illumination optical system is capable of moving at least one of the at least two filter members continuously in a direction substantially parallel to at least one of the first and second directions.

24. The exposure apparatus of claim 22 wherein the illumination optical system further comprises at least one control apparatus capable of causing the at least one drive apparatus to be driven so as to permit control of a positional relationship between at least two of the at least two filter members in a direction substantially parallel to at least one of the first and second directions.

25. The exposure apparatus of claim 23 wherein the illumination optical system further comprises at least one control apparatus capable of causing the at least one drive apparatus to be driven so as to permit control of a positional relationship between at least two of the at least two filter members in a direction substantially parallel to at least one of the first and second directions.

26. An exposure apparatus for illuminating a mask with light from at least one light source and transferring at least one pattern formed on the mask to at least one photosensitive substrate, the apparatus comprising:

a mask stage capable of moving while the mask is loaded thereon;

a substrate stage capable of moving while at least one of the one or more photosensitive substrates is loaded thereon;

at least one illumination optical system for illuminating the mask with light emitted from the at least one light source, wherein the illumination optical system comprises at least two filter members located in one or more optical paths of light emitted from the at least one light source that illuminates the mask, the at least two filter members having transmittance distributions substantially definable by a function comprising the third order or higher order power series with respect to transmittance as a function of position one or two directions substantially transverse to at least one of the one or more optical paths;

a projection optical system capable of forming on at least one of the one or more photosensitive substrates at least one image of at least one of the one or more patterns on the mask;

a mask stage drive system coupled to the mask stage and capable of causing the mask stage to move;

a substrate stage drive system coupled to the substrate stage and capable of causing the substrate stage to move; and at least one controller coupled to the mask stage drive system and the substrate stage drive system;

wherein the controller is capable of controlling the mask stage drive system and the substrate stage drive system such that the mask and at least one of the one or more photosensitive substrates are made to move in one or more directions substantially identical with or substantially parallel to one or more scan directions in correspondence to at least one magnification of the projection optical system;

wherein at least one of the one or more directions substantially transverse to at least one of the one or more optical paths being furthermore capable of being set so as to be substantially transverse to one or more directions corresponding to at least one of the one or more scan directions.

27. The exposure apparatus of claim 26 wherein the illumination optical system further comprises at least one drive apparatus capable of moving at least one of the at least two filter members in one or two directions substantially transverse to at least one of the one or more optical paths.

28. The exposure apparatus of claim 27 wherein the at least one drive apparatus in the illumination optical system is capable of moving at least one of the at least two filter members continuously in one or two directions substantially transverse to at least one of the one or more optical paths.

29. The exposure apparatus of claim 27 wherein the illumination optical system further comprises at least one control apparatus capable of causing the at least one drive apparatus to be driven so as to permit control of a positional relationship between the at least two filter members in one or two directions substantially transverse to at least one of the one or more optical paths.

30. The exposure apparatus of claim 28 wherein the illumination optical system further comprises at least one control apparatus capable of causing the at least one drive apparatus to be driven so as to permit control of a positional relationship between the at least two filter members in one or two directions substantially transverse to at least one of the one or more optical paths.

31. A microdevice manufacturing method comprising:

an expose step wherein at least one exposure apparatus for illuminating a mask with light from at least one light source and transferring at least one pattern formed on the mask to a photosensitive substrate is used to expose the photosensitive substrate so as to form images of at least one of the one or more patterns present on the mask; and a developing step wherein the image on the photosensitive substrate is developed;

wherein the exposure apparatus used comprises a mask stage constructed so as to permit the mask to be loaded thereon; a substrate stage constructed so as to permit the photosensitive substrate to be loaded thereon; and an illumination optical system for illuminating the mask with light emitted from the at least one light source, wherein the illumination optical system comprises at least two filter members located in one or more optical paths of light emitted from the at least one light source that illuminates the mask, the at least two filter members having transmittance distributions substantially definable by a function comprising the third order or higher order power series with respect to transmittance as a function of position in one or two directions substantially transverse to at least one of the one or more optical paths.

32. The microdevice manufacturing method of claim 31 wherein the illumination optical system of the exposure apparatus used during the expose step further comprises at least one drive apparatus capable of moving at least one of the at least two filter members in one or two directions substantially transverse to at least one of the one or more optical paths.

33. The microdevice manufacturing method of claim 32 wherein the at least one drive apparatus in the illumination optical system of the exposure apparatus used during the expose step is capable of moving at least one of the at least two filter members continuously in one or two directions substantially transverse to at least one of the one or more optical paths.

34. The microdevice manufacturing method of claim 32 wherein the illumination optical system of the exposure apparatus used during the expose step further comprises at least one control apparatus capable of causing the at least one drive apparatus to be driven so as to permit control of a positional relationship between the at least two filter members in one or two directions substantially transverse to at least one of the one or more optical paths.

35. The microdevice manufacturing method of claim 33 wherein the illumination optical system of the exposure apparatus used during the expose step further comprises at least one control apparatus capable of causing the at least one drive apparatus to be driven so as to permit control of a positional relationship between the t least two filter members in one or two directions substantially transverse to at least one of the one or more optical paths.

36. The microdevice manufacturing method of claim 31 wherein at least one of the at least two filter members in the illumination optical system of the exposure apparatus used during the expose step is capable of being arranged near the mask to be illuminated or substantially in a plane optically conjugate to the mask to be illuminated.

37. The microdevice manufacturing method of claim 31 wherein at least one of the at least two filter members in the illumination optical system of the exposure apparatus used during the expose step is capable of being arranged near the mask to be illuminated and substantially in a plane optically conjugate to the mask to be illuminated.

38. A microdevice manufacturing method comprising:
an expose step wherein at least one exposure apparatus for illuminating a mask with light from at least one light source and transferring at least one pattern formed on the mask to a photosensitive substrate is used to expose the photosensitive substrate so as to form images of at least one of the one or more patterns present on the mask; and a developing step wherein the image on the photosensitive substrate is developed;

wherein the exposure apparatus used comprises a mask stage constructed so as to permit the mask to be loaded thereon; a substrate stage constructed so as to permit the photosensitive substrate to be loaded thereon; and an illumination optical system for illuminating the mask with light emitted from the at least one light source, wherein the illumination optical system comprises at least two filter members located in one or more optical paths of light emitted from the at least one light source that illuminates the mask, the at least two filter members having transmittance distributions substantially definable by a function comprising the third order or higher order power series with respect to transmittance as a function of position in respectively at least a first direction which is substantially transverse to at least one of the one or more optical paths and a second direction which is substantially perpendicular to the first direction.

39. The microdevice manufacturing method of claim 38 wherein the illumination optical system of the exposure apparatus used during the expose step further comprises at least one drive apparatus capable of moving at least one of the at least two filter members in a direction substantially parallel to at least one of the first and second directions.

40. The microdevice manufacturing method of claim 39 wherein the at least one drive apparatus in the illumination optical system of the exposure apparatus used during the expose step is capable of moving at least one of the at least two filter members continuously in a direction substantially parallel to at least one of the first and second directions.

41. The microdevice manufacturing method of claim 39 wherein the illumination optical system of the exposure apparatus used during the expose step further comprises at least one control apparatus capable of causing the at least one drive apparatus to be driven so as to permit control of a positional relationship between at least two of the filter members in a direction substantially parallel to at least one of the first and second directions.

42. The microdevice manufacturing method of claim 40 wherein the illumination optical system of the exposure apparatus used during the expose step further comprises at least one control apparatus capable of causing the at least one drive apparatus to be driven so as to permit control of a positional relationship between at least two of the at least two filter members in a direction substantially parallel to at least one of the first and second directions.

* * * * *

UNITED STATES PATENT AND TRADEMARK OFFICE
CERTIFICATE OF CORRECTION

PATENT NO. : 6,819,403 B2
DATED : November 16, 2004
INVENTOR(S) : Hideki Komatsuda It is certified that error appears in the above-identified patent and that said Letters Patent is hereby corrected as shown below:

Column 28,
Lines 7-8, "claims 1-11" should read -- claims 1-5 and 7-11 --.
Lines 12-13, "claims 1-11" should read -- claims 1-5 and 7-11 --.
Line 28, "filter, members" should read -- filter members --.

Column 31,
Line 45, "t least" should read -- at least --.

Signed and Sealed this

Eighth Day of March, 2005

JON W. DUDAS
*Director of the United States Patent and Trademark Office*